US010784280B2

(12) United States Patent
Ohtori et al.

(10) Patent No.: US 10,784,280 B2
(45) Date of Patent: Sep. 22, 2020

(54) SEMICONDUCTOR MEMORY DEVICE

(71) Applicant: Toshiba Memory Corporation, Minato-ku (JP)

(72) Inventors: Hiroyuki Ohtori, Yokkaichi (JP); Satoshi Seto, Kamakura (JP); Takashi Fukushima, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/293,692

(22) Filed: Mar. 6, 2019

(65) Prior Publication Data

US 2020/0098783 A1 Mar. 26, 2020

(30) Foreign Application Priority Data

Sep. 20, 2018 (JP) ................................. 2018-175627

(51) Int. Cl.

| H01L 29/40 | (2006.01) |
|---|---|
| H01L 21/44 | (2006.01) |
| H01L 27/11582 | (2017.01) |
| H01L 23/522 | (2006.01) |
| H01L 27/1157 | (2017.01) |
| H01L 27/11565 | (2017.01) |

(52) U.S. Cl.
CPC .... *H01L 27/11582* (2013.01); *H01L 23/5226* (2013.01); *H01L 27/1157* (2013.01); *H01L 27/11565* (2013.01)

(58) Field of Classification Search
CPC ...................... H01L 21/76897; H01L 27/11582

USPC .................. 438/667–675; 257/621, 698, 774
See application file for complete search history.

(56) References Cited

U.S. PATENT DOCUMENTS

| 8,304,348 | B2 | 11/2012 | Hashimoto |
| 8,648,404 | B2 | 2/2014 | Ko et al. |
| 8,822,285 | B2 * | 9/2014 | Hwang ............. H01L 27/11551 438/257 |
| 9,401,309 | B2 * | 7/2016 | Izumi ................ H01L 21/76816 |
| 9,419,013 | B1 * | 8/2016 | Lee .................... H01L 27/11582 |
| 2009/0230449 | A1 | 9/2009 | Sakaguchi et al. |

(Continued)

FOREIGN PATENT DOCUMENTS

| JP | 2009-224565 | 10/2009 |
| JP | 201032326 A1 | 9/2010 |

(Continued)

*Primary Examiner* — Calvin Lee
(74) *Attorney, Agent, or Firm* — Oblon, McClelland, Maier & Neustadt, L.L.P.

(57) ABSTRACT

According to one embodiment, a semiconductor memory device includes the following structure. First conductive layers are stacked in first direction and extends in second and third directions. The first conductive layers each includes a pair of first portions, and second and third portions. The first portions extend in second direction, is provided separately from each other in third direction and includes a metal. The second portion is provided between the first portions and includes silicon. The third portion is provided on at least one side of the second portion in second direction, extends in third direction, electrically connects the first portions and includes a metal. Memory pillars extend through the second portions in first direction. Contact plugs are respectively provided on the third portion of one of the first conductive layers.

20 Claims, 16 Drawing Sheets

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207186 A1 | 8/2010 | Higashi et al. |
| 2010/0207195 A1 | 8/2010 | Fukuzumi et al. |
| 2011/0284946 A1 | 11/2011 | Kiyotoshi |

FOREIGN PATENT DOCUMENTS

| | | |
|---|---|---|
| JP | 2011-35237 | 2/2011 |
| JP | 2013-4690 | 1/2013 |

* cited by examiner

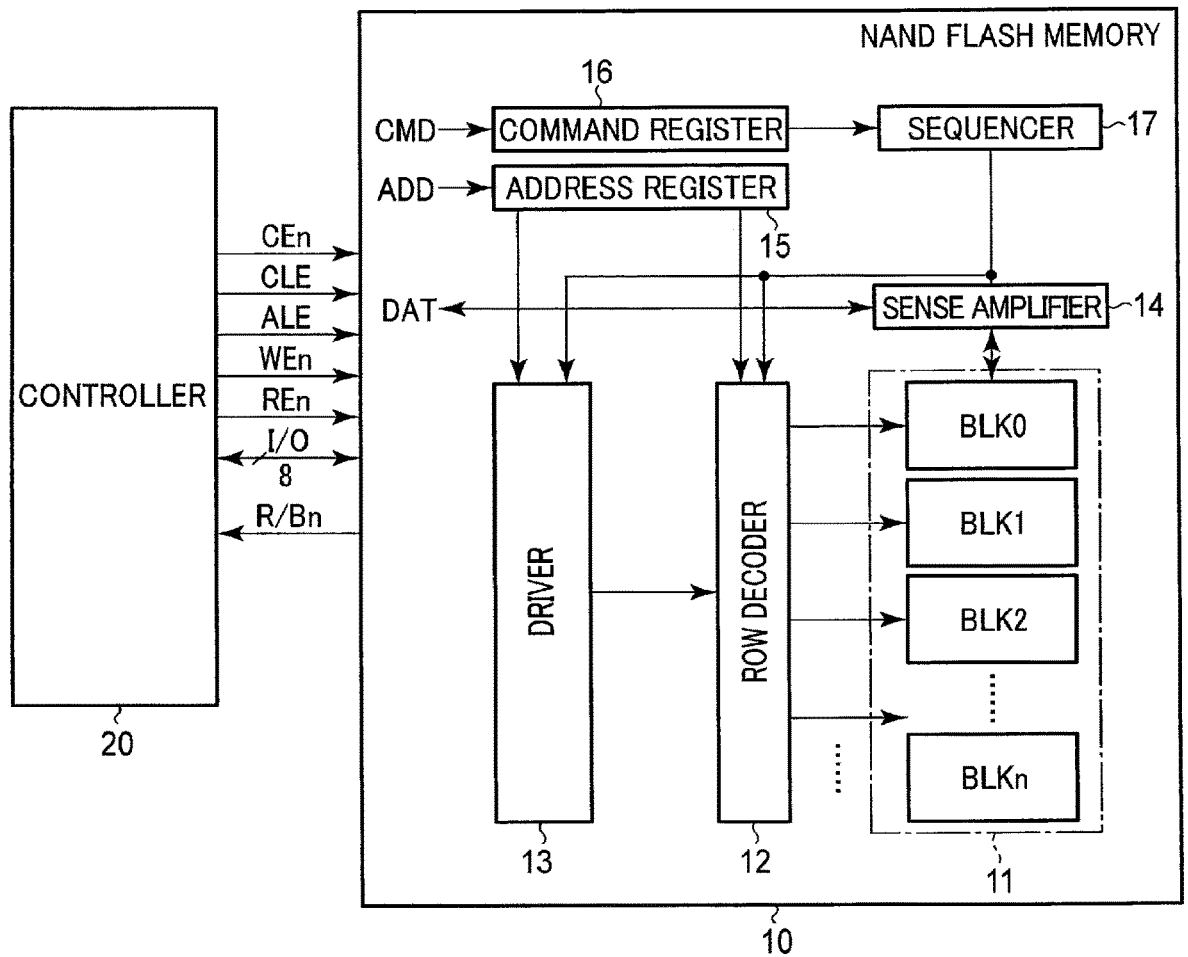
F I G. 1

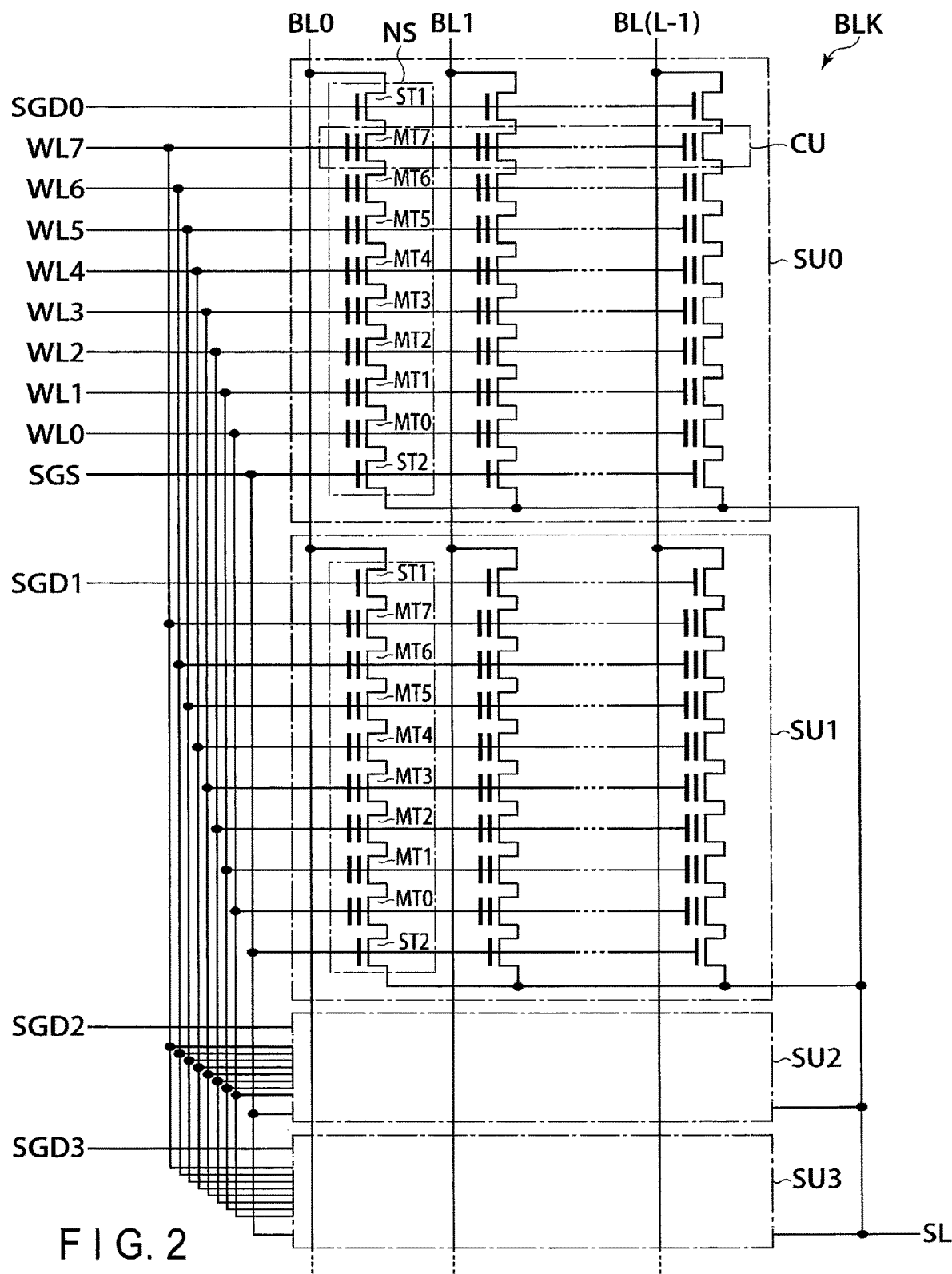
F I G. 2

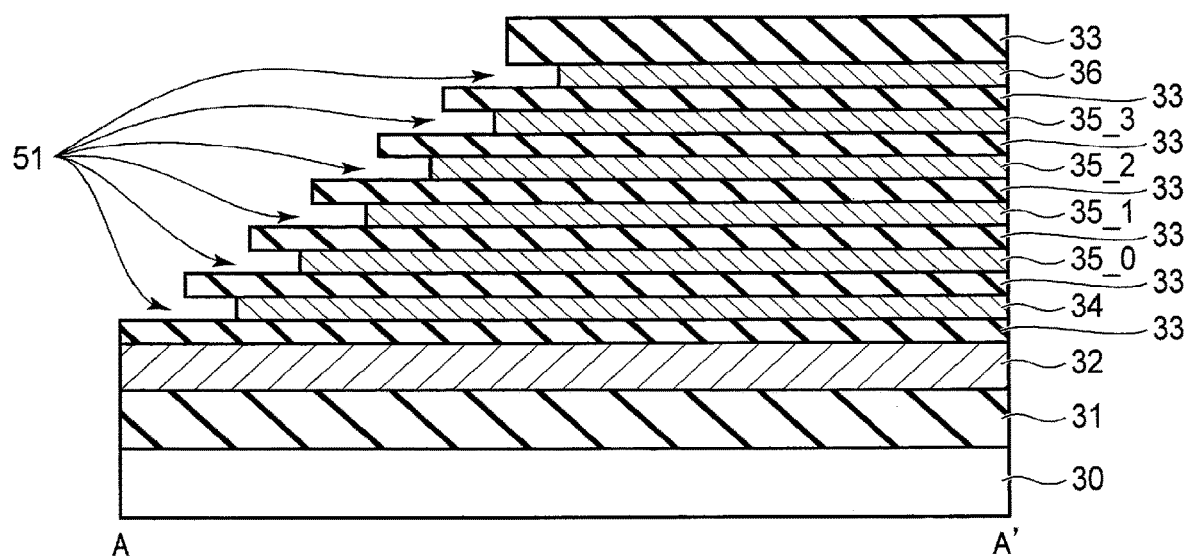
F I G. 10A
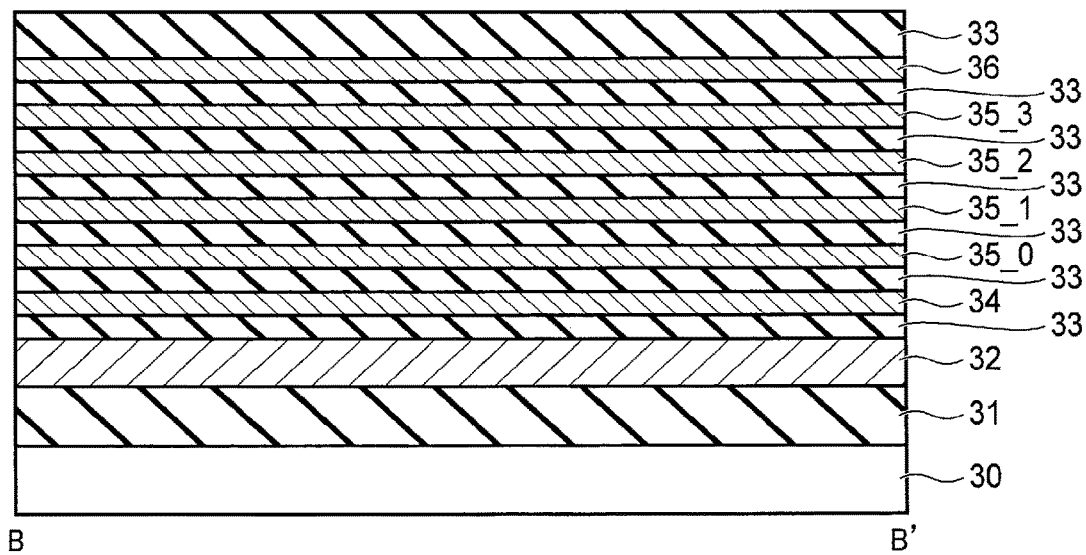
F I G. 10B

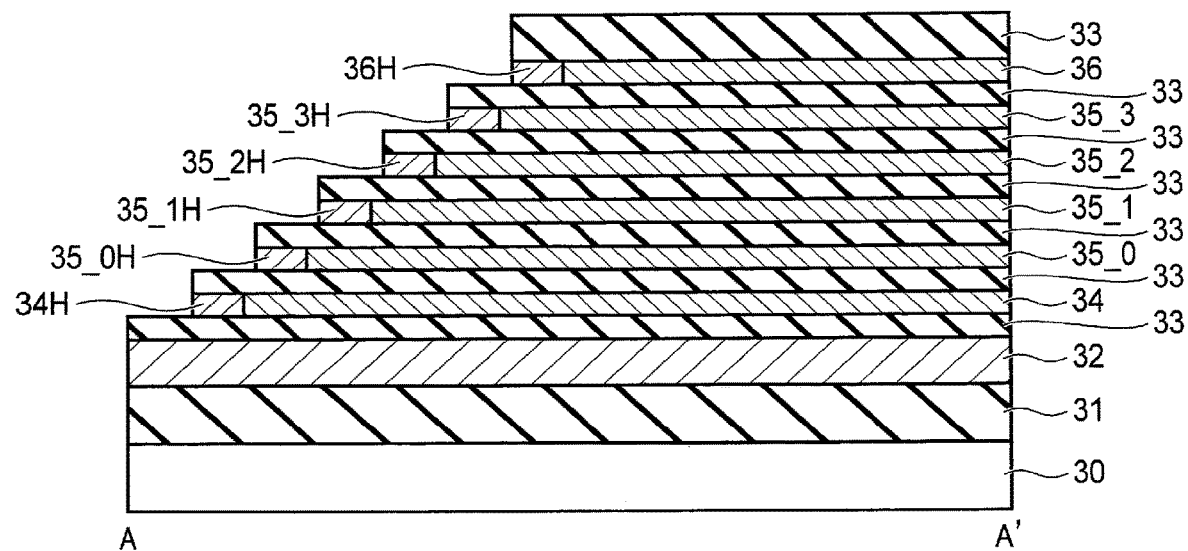
F I G. 12A
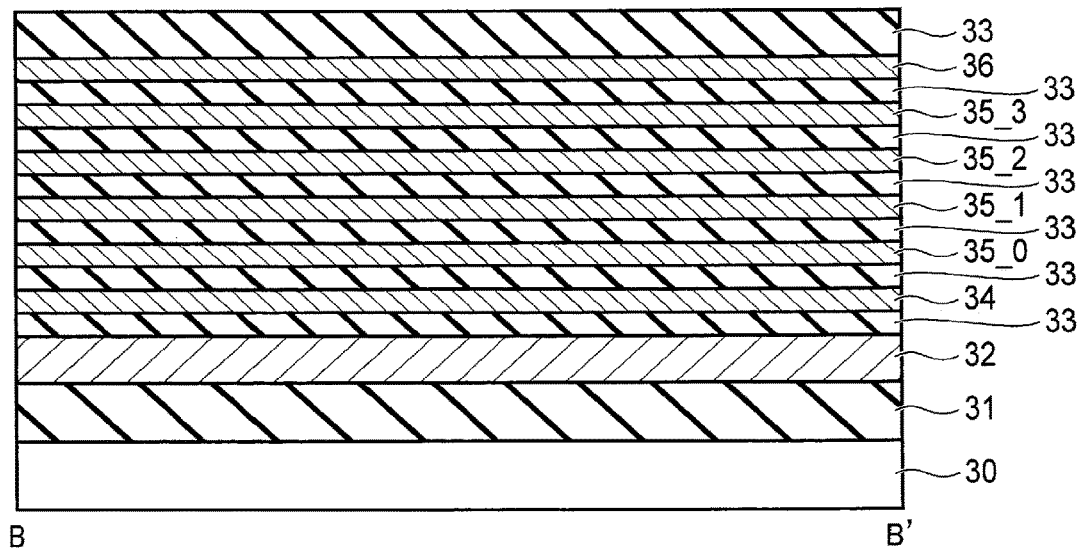
F I G. 12B

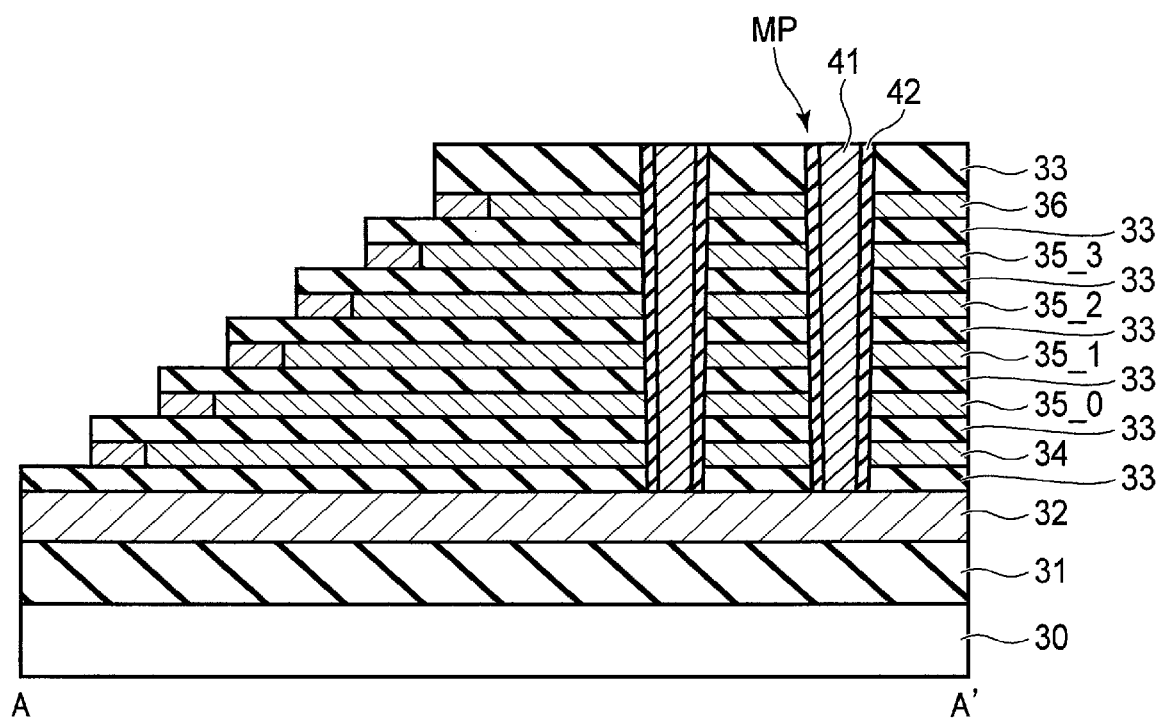
F I G. 14A
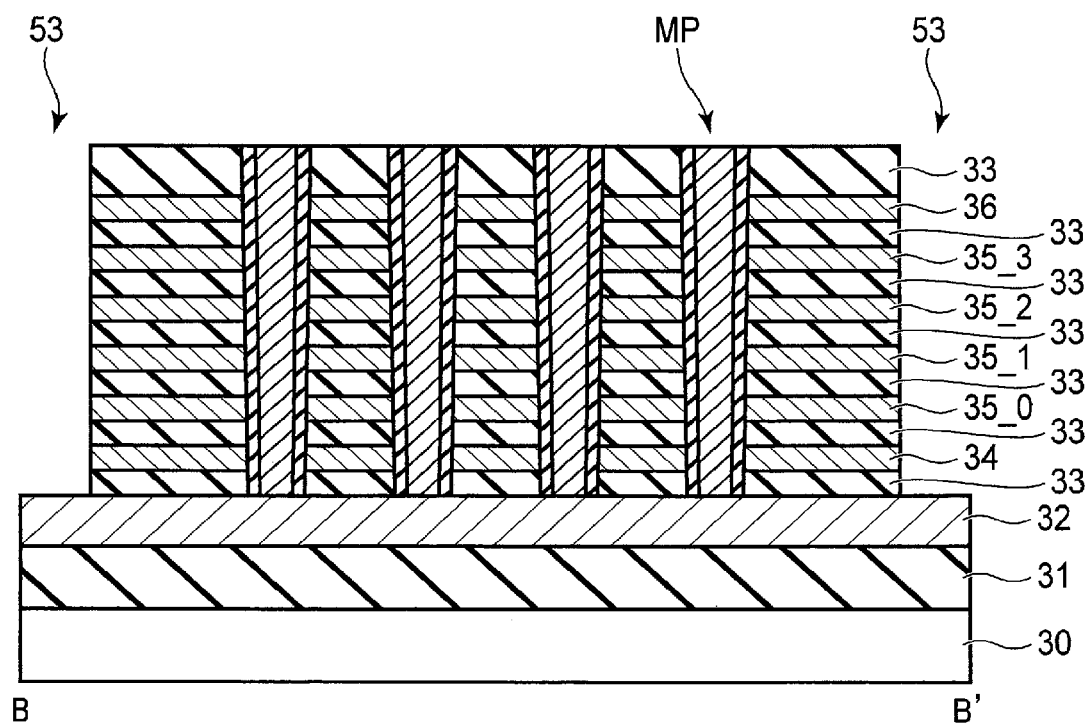
F I G. 14B

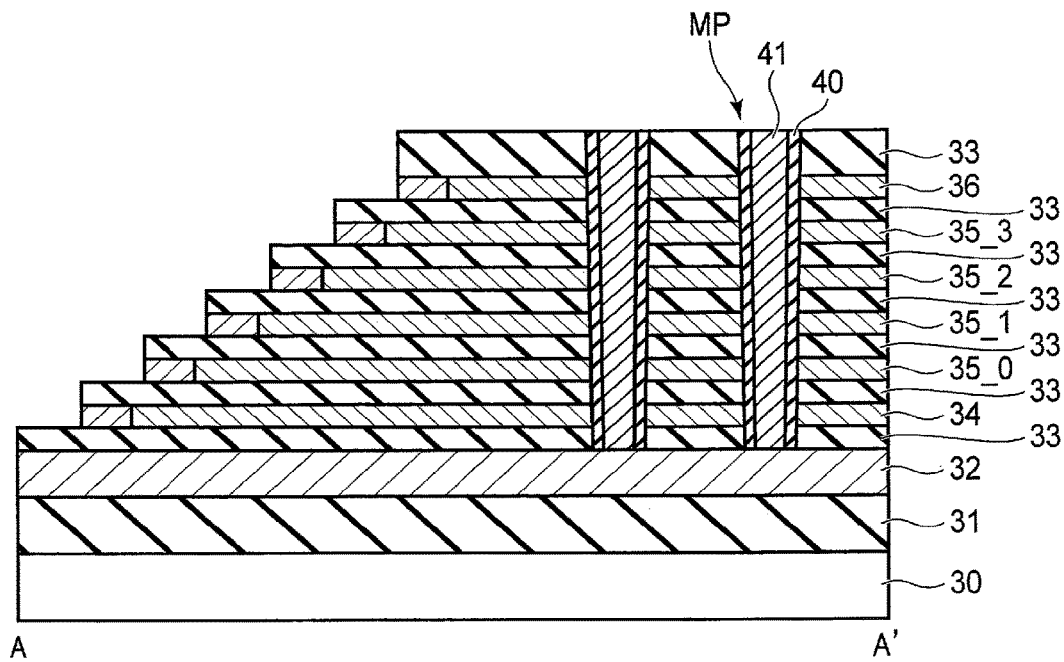
F I G. 16A
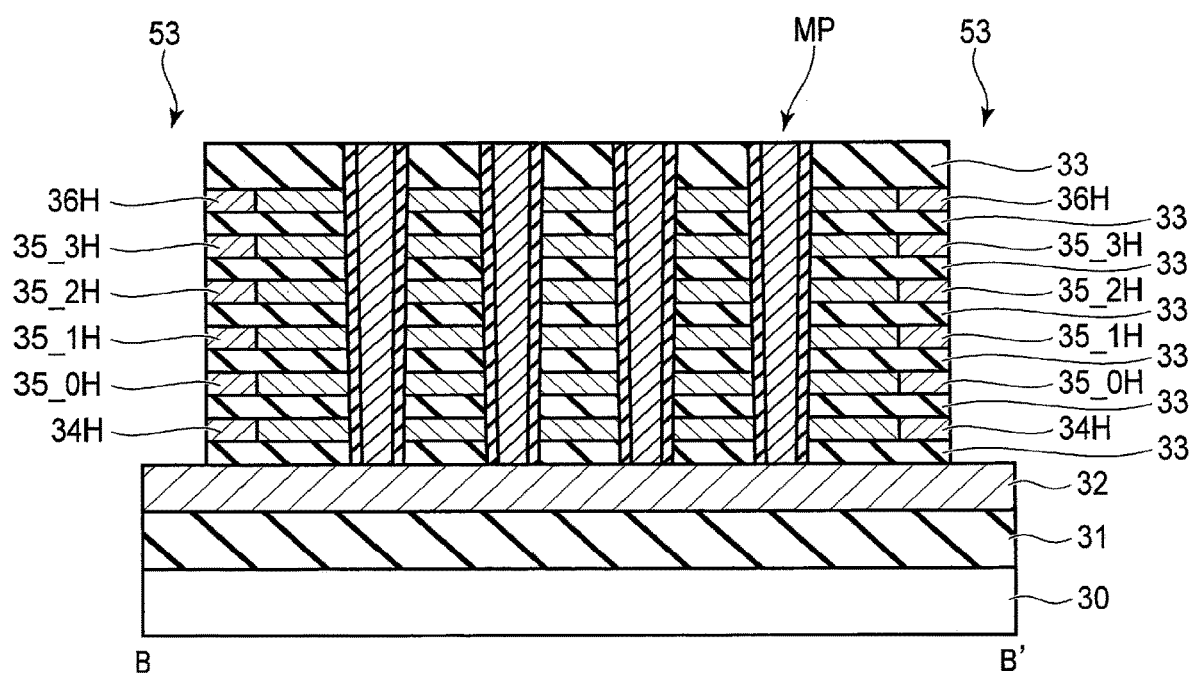
F I G. 16B

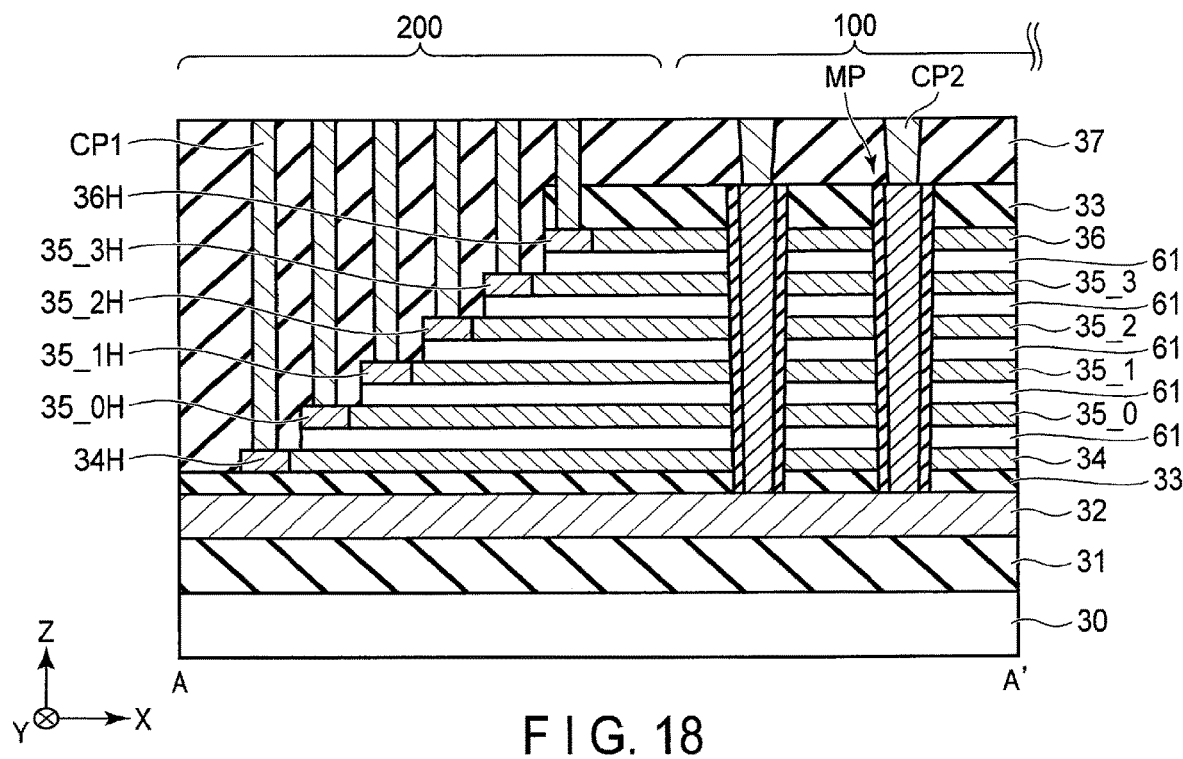
F I G. 18
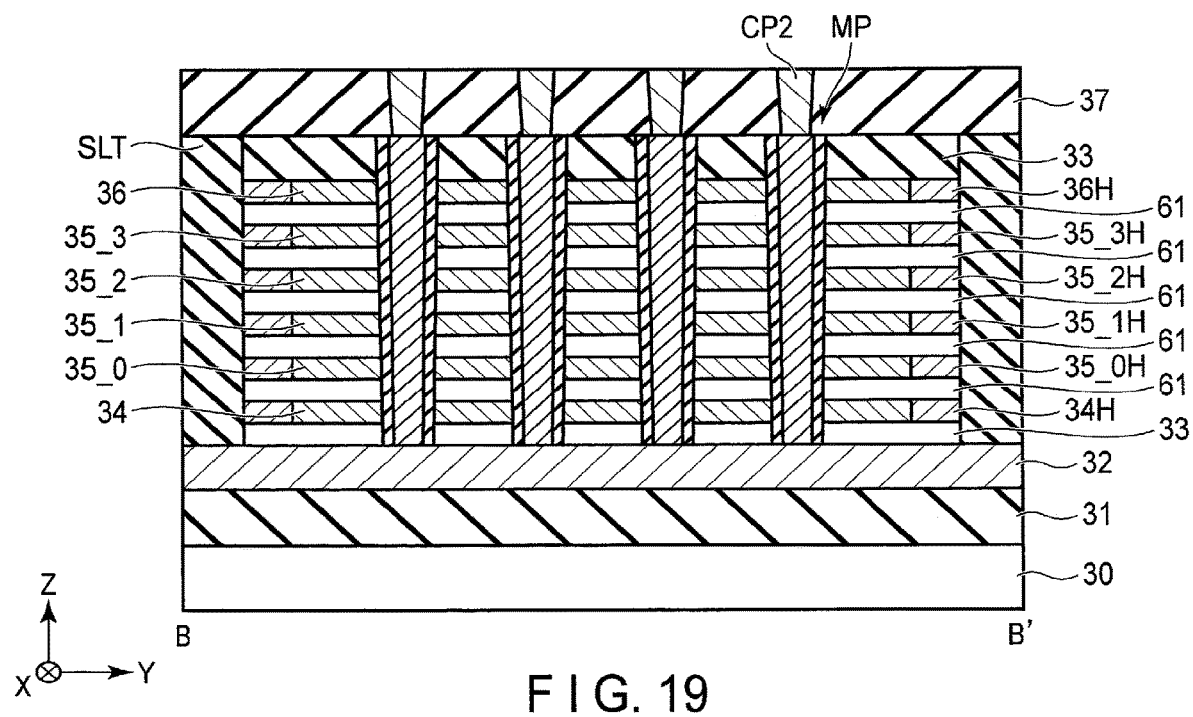
F I G. 19

SEMICONDUCTOR MEMORY DEVICE

CROSS-REFERENCE TO RELATED APPLICATIONS

This application is based upon and claims the benefit of priority from the Japanese Patent Application No. 2018-175627, filed Sep. 20, 2018, the entire contents of which are incorporated herein by reference.

FIELD

Embodiments described herein relate generally to a semiconductor memory device.

BACKGROUND

A semiconductor memory device in which memory cells are three-dimensionally arranged is known.

BRIEF DESCRIPTION OF THE DRAWINGS

FIG. 1 is a block diagram showing a circuit configuration of a semiconductor memory device according to a first embodiment.

FIG. 2 is a circuit diagram showing a block according to the first embodiment.

FIG. 10A is a cross-sectional view of the semiconductor memory device in a manufacturing step, taken along line A-A' according to the first embodiment.

FIG. 10B is a cross-sectional view of the semiconductor memory device in the manufacturing step, taken along line B-B' according to the first embodiment.

FIG. 12A is a cross-sectional view of the semiconductor memory device in a manufacturing step, taken along line A-A' according to the first embodiment.

FIG. 12B is a cross-sectional view of the semiconductor memory device in the manufacturing step, taken along line B-B' according to the first embodiment.

FIG. 14A is a cross-sectional view of the semiconductor memory device in a manufacturing step, taken along line A-A' according to the first embodiment.

FIG. 14B is a cross-sectional view of the semiconductor memory device in the manufacturing step, taken along line B-B' according to the first embodiment.

FIG. 16A is a cross-sectional view of the semiconductor memory device in a manufacturing step, taken along line A-A' according to the first embodiment.

FIG. 16B is a cross-sectional view of the semiconductor memory device in the manufacturing step, taken along line B-B' according to the first embodiment.

FIG. 18 is a cross-sectional view of a semiconductor memory device, taken along line A-A' according to a second embodiment.

FIG. 19 is a cross-sectional view of the semiconductor memory device, taken along line B-B' according to the second embodiment.

DETAILED DESCRIPTION

Figure 3:
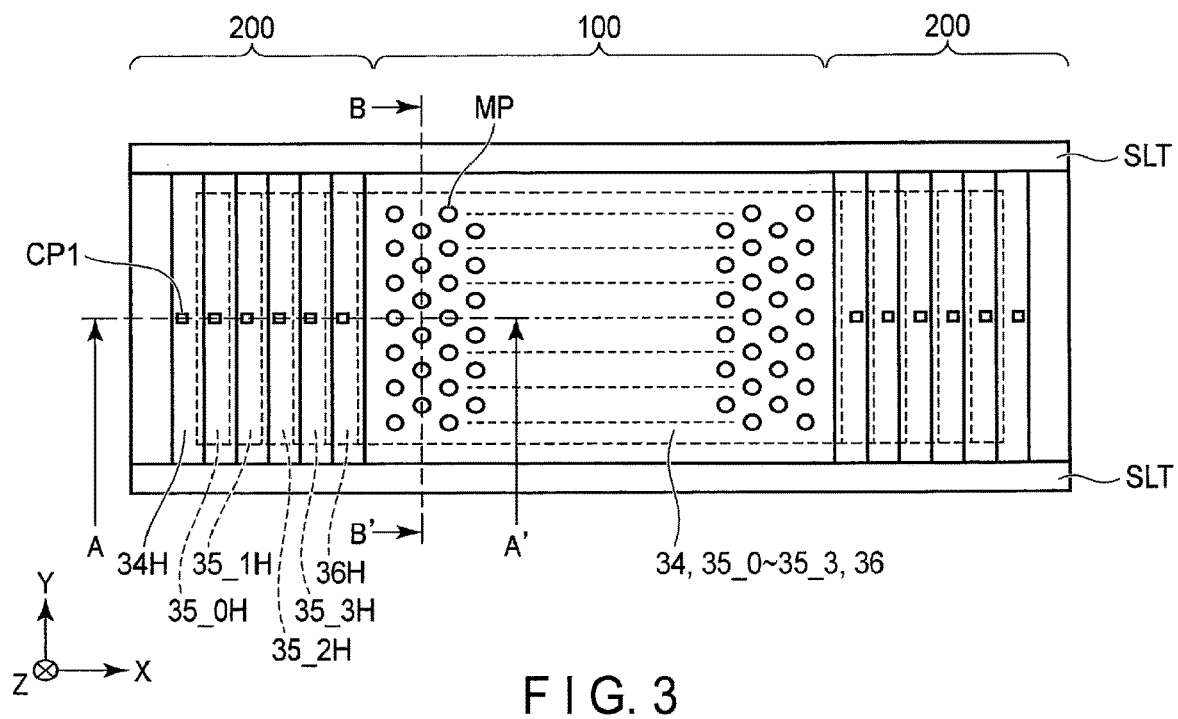
FIG. 3 is a plan view of the semiconductor memory device according to the first embodiment.

In general, according to one embodiment, a semiconductor memory device includes: a plurality of first conductive layers stacked in a first direction and extending in a second direction and a third direction crossing the first direction; a plurality of memory pillars extending through the first conductive layers in the first direction; and a plurality of contact plugs provided on the first conductive layers and extending in the first direction. The first conductive layers each includes: a pair of first portions extending in the second direction, provided separately from each other in the third direction, and including a metal; a second portion provided between the first portions and including silicon; and a third portion provided on at least one side of the second portion in the second direction, extending in the third direction, electrically connecting first portions each other, and including a metal. The memory pillars extend through the second portion of the first conductive layers. The contact plugs are respectively provided on the third portion of one of the first conductive layers.

Hereinafter, embodiments will be described with reference to the drawings. In the description below, structural elements having the same functions and configurations will be denoted by the same reference symbols. Each of the embodiments described below merely shows an exemplary apparatus and method for implementing the technical idea of the embodiment. The element materials, shapes, structures, arrangements, etc., are not limited to those described below.

Each of the function blocks can be implemented in the form of hardware, computer software, or a combination thereof. The function blocks do not have to be distinguished from each other as in the example described below. For example, part of the functions may be implemented by a function block other than the exemplary function blocks. In addition, the exemplary function blocks may be further divided into function sub-blocks. As an example of a nonvolatile semiconductor memory device, a three-dimensionally stacked NAND flash memory in which memory cell transistors are stacked above a semiconductor substrate will be described.

1. First Embodiment

A semiconductor memory device according to a first embodiment will be described.

1.1 Circuit Block Configuration of Semiconductor Memory Device

A circuit block configuration of the semiconductor memory device according to the first embodiment will be described. FIG. 1 is a block diagram showing a circuit configuration of the semiconductor memory device according to the first embodiment. A NAND flash memory 10 as a semiconductor memory device includes a memory cell array 11, a row decoder 12, a driver 13, a sense amplifier 14, an address register 15, a command register 16, and a sequencer 17. For example, an external controller 20 is connected to a NAND flash memory 10 via a NAND bus. The controller 20 accesses and controls the NAND flash memory 10.

1.1.1 Configuration of Each Block

The memory cell array 11 has a plurality of blocks BLK0, BLK1, BLK2, . . . , BLKn (n is an integer of 0 or more) each including a plurality of nonvolatile memory cells associated with rows and columns. A term, "block BLK" hereinafter refers to each of the blocks BLK0 to BLKn. The memory cell array 11 stores data provided from the controller 20. Details of the memory cell array 11 and the block BLK will be described later.

The row decoder 12 selects one block BLK, and selects a word line in the selected block BLK. Details of the row decoder 12 will be explained later.

The driver 13 supplies a voltage to the selected block BLK via the row decoder 12.

Upon reading of data, the sense amplifier 14 senses data DAT read from the memory cell array 11, and carries out necessary calculations. Then, the sense amplifier 14 outputs this data DAT to the controller 20. Upon writing of data, the sense amplifier 14 transfers write data DAT received from the controller 20 to the memory cell array 11.

The address register 15 stores an address ADD received from the controller 20. The address ADD includes a block address designating a block BLK to which the operation is performed, and a page address indicating a word line to which the operation is performed in the designated block. The command register 16 stores a command CMD received from the controller 20. The command CMD includes a write command to command the sequencer 17 to carry out a write operation, and a read command to command the sequencer 17 to carry out a read operation, for example.

The sequencer 17 controls the operation of the NAND flash memory 10 based on the command CMD stored in the command register 16. Specifically, the sequencer 17 writes into a plurality of memory cell transistors designated by the address ADD by controlling the row decoder 12, the driver 13, and the sense amplifier 14, based on the write command stored in the command register 16. The sequencer 17 reads from the plurality of memory cell transistors designated by the address ADD by controlling the row decoder 12, the driver 13, and the sense amplifier 14, based on the read command stored in the command register 16.

As described above, the controller 20 is connected to the NAND flash memory 10 via the NAND bus. The NAND bus transmits and receives signals in accordance with the NAND interface. Specifically, the NAND bus includes a bus that communicates a chip enable signal CEn, a command latch enable signal CLE, an address latch enable signal ALE, a write enable signal WEn, a read enable signal REn, an input/output signal I/O, and an ready/busy signal R/Bn, for example. The input/output signal I/O is transmitted with a bus width of 8 bits. An input/output signal I/O communicates a command CMD, an address ADD, and data DAT, for example.

1.1.2 Circuit Configuration of Memory Cell Array 11

As described above, the memory cell array 11 includes blocks BLK0 to BLKn. The blocks BLK0 to BLKn have the same configuration. The circuit configuration of one block BLK will be explained below.

FIG. 2 is a circuit diagram of a block BLK included in the memory cell array 11. As shown in FIG. 2, the block BLK includes four string units SU0 to SU3, for example. A term, "string unit SU" hereinafter refers to each of the string units SU0 to SU3. A string unit SU includes a plurality of NAND strings NS.

Each NAND string NS includes eight memory cell transistors MT0 to MT7 and select transistors ST1 and ST2, for example. A term, "memory cell transistor MT" hereinafter refers to each of the memory cell transistors MT0 to MT7. A memory cell transistor (which will also be referred to as a "memory cell") MT includes a control gate and a charge storage layer, and stores data in a nonvolatile manner. Memory cell transistors MT are coupled in series between the source of the select transistor ST1 and the drain of the select transistor ST2.

The gates of the select transistors ST1 of the string units SU0 to SU3 are respectively coupled to select gate lines SGD0 to SGD3. On the other hand, the gates of the select transistors ST2 of each of the string units SU0 to SU3 are coupled to one select gate line SGS, for example. The gates of the select transistors ST2 may be respectively coupled to select gate lines SGS0 to SGS3 corresponding to respective string units. The control gates of the memory cell transistors MT0 to MT7 in the string units SU0 to SU3 in the block BLK are respectively coupled to word lines WL0 to WL7.

In the memory cell array 11, the blocks BLK0 to BLKn share the bit lines BL0 to BL(L-1). L is an integer of 2 or more. In the string units SU0 to SU3 in the block BLK, each bit line BL is coupled in common to the drains of the select transistors ST1 of the NAND strings NS in the same row. In other words, each bit line BL couples the NAND strings NS in common among the string units SU0 to SU3 in the same row. Furthermore, the sources of the select transistors ST2 are coupled to a source line SL in common. In other words, the string unit SU includes NAND strings NS that are coupled to different bit lines BL and are coupled to the same select gate line SGD.

A block BLK includes the string units SU that share the word lines WL.

A plurality of memory cell transistors MT coupled to a common word line WL in a string unit. SU are called a cell unit CU. The storage capacity of the cell unit CU changes in accordance with the number of bits of data stored in the memory cell transistors MT. For example, a cell unit CU stores one-page data if each memory cell transistor MT stores 1-bit data, stores two-page data if each memory cell transistor MT stores 2-bit data, and stores three-page data if each memory cell transistor MT stores 3-bit data.

The configuration of the memory cell array 11 is not limited to the above-described configuration. For example, the number of string units SU included in each block BLK may be set to any number. For example, the numbers of the memory cell transistors MT and the select transistors ST1 and ST2 that are included in each NAND string NS may be respectively set to any numbers.

The configuration of the memory cell array 11 is described in U.S. patent application Ser. No. 12/407,403 filed on Mar. 19, 2009 and titled "THREE DIMENSIONAL STACKED NONVOLATILE SEMICONDUCTOR MEMORY," for example. The configuration of the memory cell array 11 is also described in U.S. patent application Ser. No. 12/406,524 filed on Mar. 18, 2009 and titled "THREE DIMENSIONAL STACKED NONVOLATILE SEMICONDUCTOR MEMORY," U.S. patent application Ser. No. 12/679,991 filed on Mar. 25, 2010 and titled "NON-VOLATILE SEMICONDUCTOR STORAGE DEVICE AND METHOD OF MANUFACTURING THE SAME," and U.S. patent application Ser. No. 12/532,030 filed on Mar. 23, 2009 and titled "SEMICONDUCTOR MEMORY AND METHOD FOR MANUFACTURING SAME." The entire contents of these applications are incorporated herein by reference.

1.2 Structure of Semiconductor Memory Device

Figure 4:
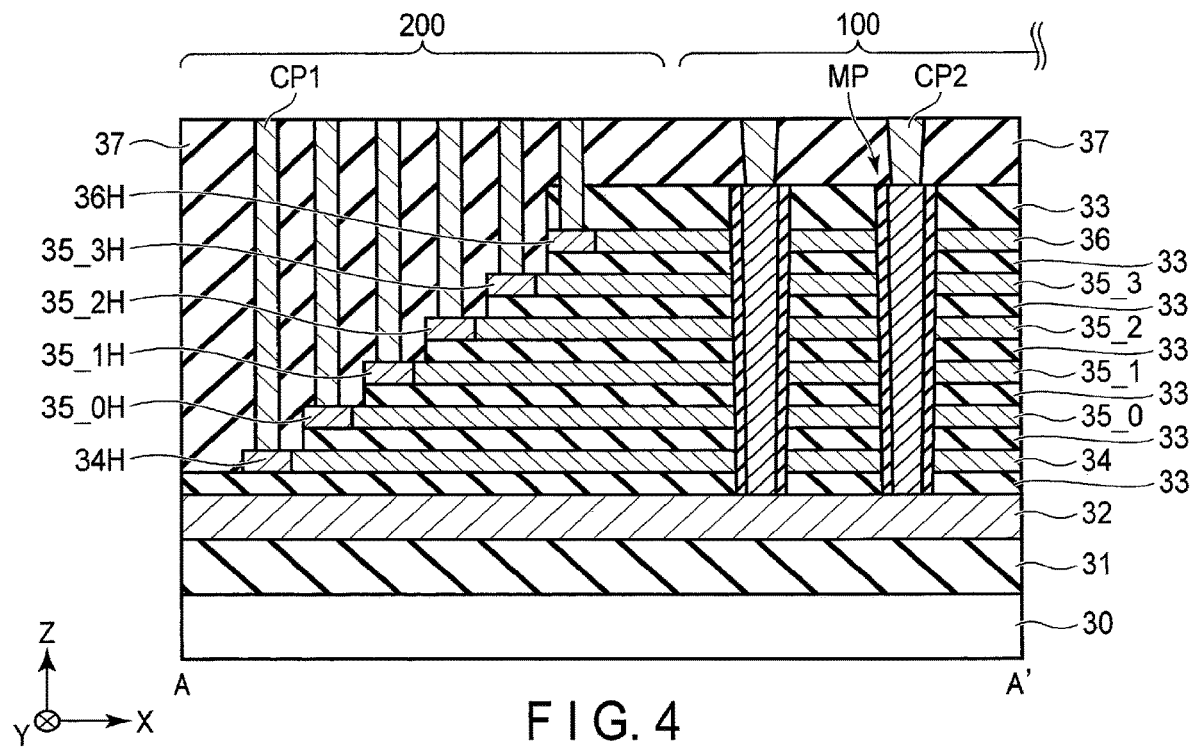
FIG. 4 is a cross-sectional view taken along line A-A' shown in FIG. 3.
Figure 5:
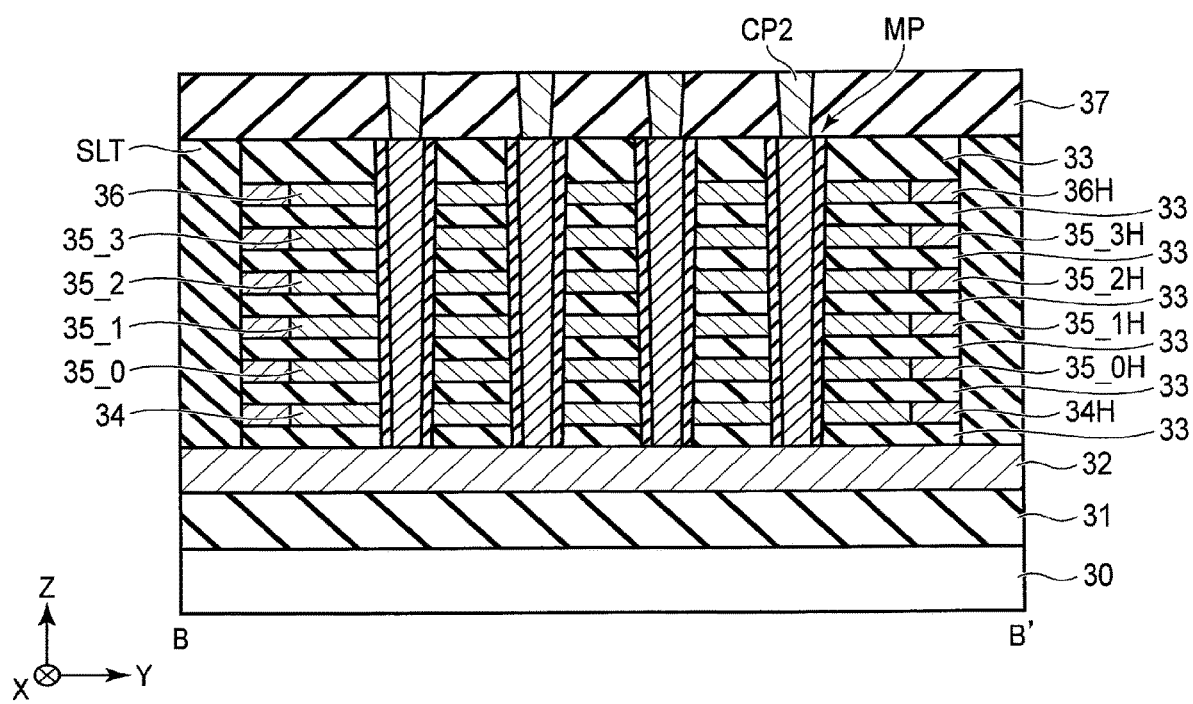
FIG. 5 is a cross-sectional view taken along line B-B' shown in FIG. 3.

The structure of the semiconductor memory device according to the first embodiment will be explained. FIG. 3 is a planar view showing a part of the semiconductor memory device according to the first embodiment. FIG. 4 is a cross-sectional view taken along line A-A' shown in FIG. 3. FIG. 5 is a cross-sectional view taken along line B-B' shown in FIG. 3. In the drawings including FIGS. 3 to 5, two directions orthogonal to (or intersecting with) each other and parallel to the surface of a semiconductor substrate are defined as an X direction (line A-A' direction) and a Y direction (line B-B' direction), and a direction orthogonal to (or intersecting with) the X direction and Y direction (XY plane) is defined as a Z direction. The bit lines are not shown in FIGS. 3 to 5.

As shown in FIG. 3, the semiconductor memory device has memory array areas 100 and hookup areas 200. A plurality of memory array areas 100 and hookup areas 200 are arranged in the Y direction. Slits SLT (dividing areas) extending in the X direction isolate memory array areas 100 from each other and respective hookup areas 200 from each other. The number of the slits SLT isolating the memory array areas 100 from each other and the hookup areas 200 from each other may be any number.

A plurality of conductive layers 34, 35_0, 35_1, 35_2, 35_3, and 36 extending in the X direction and stacked in the Z direction are provided in the memory array areas 100 and the hookup areas 200 Electrode layers 34H, 35_0H, 35_1H, 35_2H, 35_3H, and 36H are provided at both ends of the conductive layers in the X direction and the Y direction, namely around the conductive layers, respectively.

A memory array area 100 has a plurality of memory pillars MP. The memory pillars MP are arranged in a staggered manner relative to the X and Y directions, for example. The number of the memory pillars MP may be any number.

The hookup area 200 has the electrode layers 34H, 35_0H, 35_1H, 35_2H, 35_3H, and 36H provided at the end portions of the conductive layers 34, 35_0, 35_1, 35_2, 35_3, and 36. A plurality of contact plugs CP1 are provided on the electrode layers 34H, 35_0H to 35_3H, and 36H, respectively. The contact plugs CP1 extend in the Z direction, and are arranged in the X direction. FIG. 3 shows an example where the hookup areas 200 are provided on both end sides of the memory array area 100; however, the configuration is not limited thereto, and a hookup area 200 may be provided only on either side of the memory array area 100.

A cross-sectional structure of the semiconductor memory device will be explained with reference to FIGS. 4 to 5. An insulation layer 31 is provided on a semiconductor substrate (e.g., a silicon monocrystalline substrate) 30. A conductive layer 32 is provided on the insulation layer 31. The conductive layer 32 functions as a source line SL. The insulation layer 31 includes a silicon oxide layer, for example. The conductive layer 32 includes polycrystalline silicon or tungsten (W), for example.

A stacked body is provided on the conductive layer 32. In the stacked body, a plurality of insulation layers 33 and a plurality of conductive layers 34, 35_0, 35_1, 35_2, 35_3, and 36 are alternately stacked in the Z direction. The conductive layers 34, 35_0 to 35_3, and 36 have a plate-like shape parallel to the surface of the semiconductor substrate 30, and extend in the X direction. Each insulation layer 33 includes a silicon oxide layer, for example. The conductive layers 34, 35_0 to 35_3, and 36 include polycrystalline silicon to which impurities are added, for example.

Columnar memory pillars MP extending in the Z direction are provided through the plurality of insulation layers 33 and the conductive layers 34, 35_0 to 35_3, and 36. One end of each memory pillar MP is coupled to the conductive layer (source line SL) 32. The other end of each memory pillar MP reaches the top surface of the uppermost insulation layer 33. In other words, the memory pillars MP extend from the top surface of the uppermost insulation layer 33 to the source line SL through a select gate line SGD, a plurality of word lines WL0 to WL3, a select gate line SGS, and the plurality of insulation layers 33. Details of the memory pillars MP will be explained later.

An insulation layer 37 is provided on the uppermost insulation layer 33. In the insulation layer 37 on the other end of the memory pillars MP, contact plugs CP2 extending in the Z direction are provided. Each contact plug CP2 is coupled to a bit line BL (not shown), for example. The insulation layer 37 includes a silicon oxide layer, for example. The contact plugs CP2 include tungsten (W), for example.

As shown in FIG. 4, in the hookup area 200, the conductive layers 34, 35_0 to 35_3, and 36 respectively have areas arranged in a stepwise manner in the X direction in order (hereinafter referred to as "stepped areas" or "coupling areas"). In the stepped areas of the conductive layers 34, 35_0 to 35_3, and 36, the electrode layers 34H, 35_0H to 35_3H, and 36H are respectively provided. In other words, as shown in FIG. 4, the electrode layers 34H, 35_0H to 35_3H, and 36H are respectively provided at both ends of the conductive layers 34, 35_0 to 35_3, and 36 in the X direction. As shown in FIG. 5, electrode layers 34H, 35_0H to 35_3H, and 36H are also respectively provided at both ends of the conductive layers 34, 35_0 to 35_3, and 36 in the Y direction. In other words, electrode layers 34H, 35_0H to 35_3H, and 36H are respectively provided around the conductive layers 34, 35_0 to 35_3, and 36. The thicknesses of the electrode layers 34H, 35_0H to 35_3H, and 36H in the Z direction are respectively the same as the thicknesses of the conductive layers 34, 35_0 to 35_3, and 36 in the Z direction.

The conductive layer 34 and the electrode layer 34H function as a select gate line SGS. The conductive layer 35_0 and the electrode layer 35_0H function as a word line WL0, the conductive layer 35_1 and the electrode layer 35_1H function as a word line WL1, the conductive layer 35_2 and the electrode layer 35_2H function as a word line WL2, the conductive layer 35_3 and the electrode layer 35_3H function as a word line WL3, and the conductive layer 36 and the electrode layer 36H function as a select gate line SGD.

The insulation layer 37 is provided on the conductive layers 34, 35_0 to 35_3, and 36 and the stepped areas in the hookup area 200. In the insulation layer 37, contact plugs CP1 extending in the Z direction are provided on the respective electrode layers 34H, 35_0H to 35_3H, and 36H. The contact plugs CP1 extend from the top surface of the insulation layer 37 to the respective electrode layers 34H, 35_0H to 35_3H, and 36H. In other words, the contact plugs CP1 are electrically coupled to the conductive layers 34, 35_0 to 35_3, and 36 via the electrode layers 34H, 35_0H to 35_3H, and 36H, respectively. The lengths of the electrode layers 34H, 35_0H to 35_3H, and 36H in the X direction are greater than an outer diameter of a contact plug CP1. The contact plugs CP1 include tungsten (W), for example.

Slits SLT that have a plate-like shape parallel to the XZ plane and extend in the X direction are provided at both ends of the memory array area 100 and the hookup areas 200 in the Y direction. The slits SLT isolates in the Y direction respective memory array areas 100 and respective hookup areas 200 arranged in the Y direction from each other. In other words, the slits SLT divide the word lines WL0 to WL3 and the select gate lines SGS and SGD among respective memory array areas 100 and respective hookup areas 200.

1.2.1. Structure of Memory Cell Array

Figure 6:
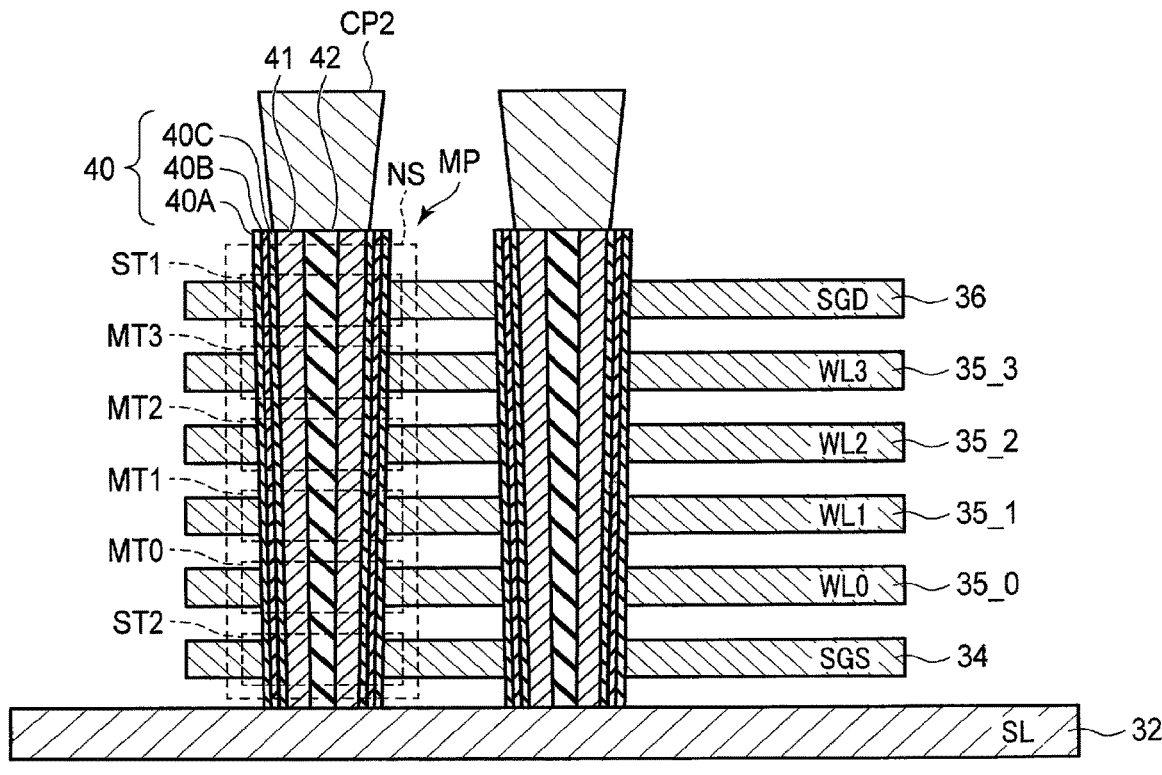
FIG. 6 is a cross-sectional view of memory pillars according to the first embodiment.

Next, the structure of the memory cell array (the plurality of memory pillars MP) will be described in detail. FIG. 6 is a cross-sectional view of memory pillars of the memory cell array taken along the Y direction. The insulation layers are not shown herein.

The memory cell array has a plurality of NAND strings NS. One end of each NAND string NS is coupled to the conductive layer (source line SL) 32, and the other end of each NAND string NS is coupled to the contact plugs CP2. Each NAND string NS has a select transistor ST1, memory cell transistors MT0 to MT3, and a select transistor ST2.

Provided on the conductive layer 32 are the conductive layer (select gate line SGS) 34, the conductive layers (word lines WL0 to WL3) 35_0 to 35_3, and the conductive layer (select gate line SGD) 36 that are stacked separately from each other, and memory pillars MP penetrating the conductive layers 34, 35_0 to 35_3, and 36. The plurality of NAND strings NS are formed at the portions where the conductive layers 34, 35_0 to 35_3, and 36 cross the memory pillars MP.

Each memory pillar MP has a cell insulation film 40, a semiconductor layer 41, and a core insulation layer 42, for example. The cell insulation film 40 includes a block insulation film 40A, a charge storage film 40B, and a tunnel insulation film (or a tunnel oxide film) 40C. Specifically, the block insulation film 40A is provided on the inner wall of a memory hole for forming a memory pillar MP. The charge storage film 40B is provided on the inner wall of the block insulation film 40A. The tunnel insulation film 40C is provided on the inner wall of the charge storage film 40B. The semiconductor layer 41 is provided on the inner wall of the tunnel insulation film 40C. Furthermore, the core insulation layer 42 is provided inside the semiconductor layer 41.

In the above configuration of a memory pillar MP, the intersection where the memory pillar MP crosses the conductive layer 34 functions as a select transistor ST2. The intersections where the memory pillar MP crosses the conductive layers 35_0 to 35_3 function as memory cell transistors MT0 to MT3, respectively. The intersection where the memory pillar MP crosses the conductive layer 36 functions as a select transistor ST1. A term, "memory cell transistor MT" hereinafter refers to each of the memory cell transistors MT0 to MT3.

The semiconductor layer 41 functions as a channel layer of the memory cell transistor MT and the select transistors ST1 and ST2.

In a memory cell transistor MT, the charge storage film 40B functions as a film that stores charges injected from the semiconductor layer 41. The charge storage film 40B includes a silicon nitride film, for example.

The tunnel insulation film 40C functions as a potential barrier when charges are injected from the semiconductor layer 41 into the charge storage film 40B or when the charges stored in the charge storage film 40B diffuse into the semiconductor layer 41. The tunnel insulation film 40C includes a silicon oxide film, for example.

The block insulation film 40A prevents the charges stored in the charge storage film 40B from diffusing into the conductive layers (word lines WL) 35_0 to 35_3. The block insulation film 40A includes a silicon oxide film and a silicon nitride film, for example.

1.2.2. Structure of Word Lines and Select Gate Lines

Next, the planer configurations of the word lines WL0 to WL3 and the select gate lines SGD and SGS will be described in detail. The planer configurations of the word lines WL0 to WL3 and the select gate lines SGD and SGS are the same except for the lengths in the X direction. Among the word lines WL0 to WL3 and the select gate lines SGD and SGS, the word line WL3 will be explained as an example.

Figure 7:
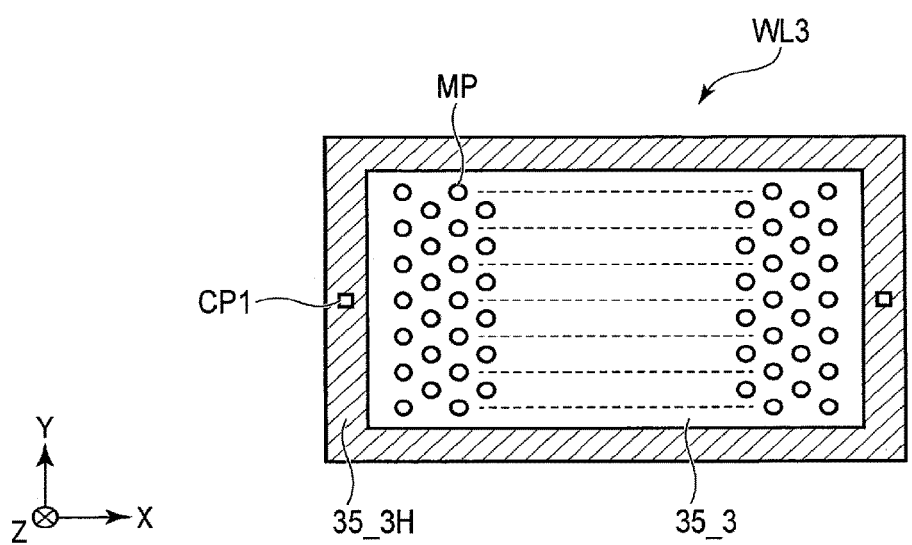
FIG. 7 is a plan view of a word line according to the first embodiment.

FIG. 7 is a plan view of the word line WL3 according to the first embodiment. As shown in FIG. 7, a plurality of memory pillars MP extending in the Z direction are provided in the conductive layer 35_3. The electrode layer 35_3H is provided at both ends of the conductive layer 35_3 in the X direction and the Y direction. In other words, the electrode layer 35_3H is provided around the conductive layer 35_3. The electrode layer 35_3H is in contact with the conductive layer 35_3, and is electrically coupled to the conductive layer 35_3.

The electrode layer 35_3H has an electric resistance lower than that of the conductive layer 35_3. Specifically, the electrode layer 35_3H includes a conductive material with lower electric resistance than the conductive layer 35_3; for example, a metal material such as tungsten (W), copper (Cu) or aluminum (Al).

A contact plug CP1 extending in the Z direction is provided on the electrode layer 35_3H arranged on one end (the stepped area or the coupling area) of the conductive layer 35_3 in the X direction. The contact plug CP1 is in contact with the electrode layer 35_3H, and is electrically coupled to the conductive layer 35_3 via the electrode layer 35_3H.

A predetermined voltage is applied to the word line WL3 that includes the conductive layer 35_3 and the electrode layer 35_3H via the contact plug CP1 upon operations to write and read, etc. Similarly, a predetermined voltage is also respectively applied to the word lines WL0 to WL2 including conductive layers and electrode layers and the select gate lines SGD and SGS via other contact plugs CP1 upon operations to write and read, etc.

The electrode layers 35_3H provided at both ends of the conductive layer 35_3 in the X direction and the Y direction may be made of the same conductive material (or metal material). The electrode layers 35_3H provided at both ends of the conductive layer 35_3 in the X direction may be made of a different conductive material (or metal material) from the electrode layers 35_3H provided at both ends of the conductive layer 35_3 in the Y direction. Alternatively, different conductive materials (or metal materials) may be selected and used for each of the electrode layers 35_3H provided at one end and the other end of the conductive layer 35_3 in the X direction and provided at one end and the other end of the conductive layer 35_3 in the Y direction.

1.3 Manufacturing Method of Semiconductor Memory Device

Figure 8A:
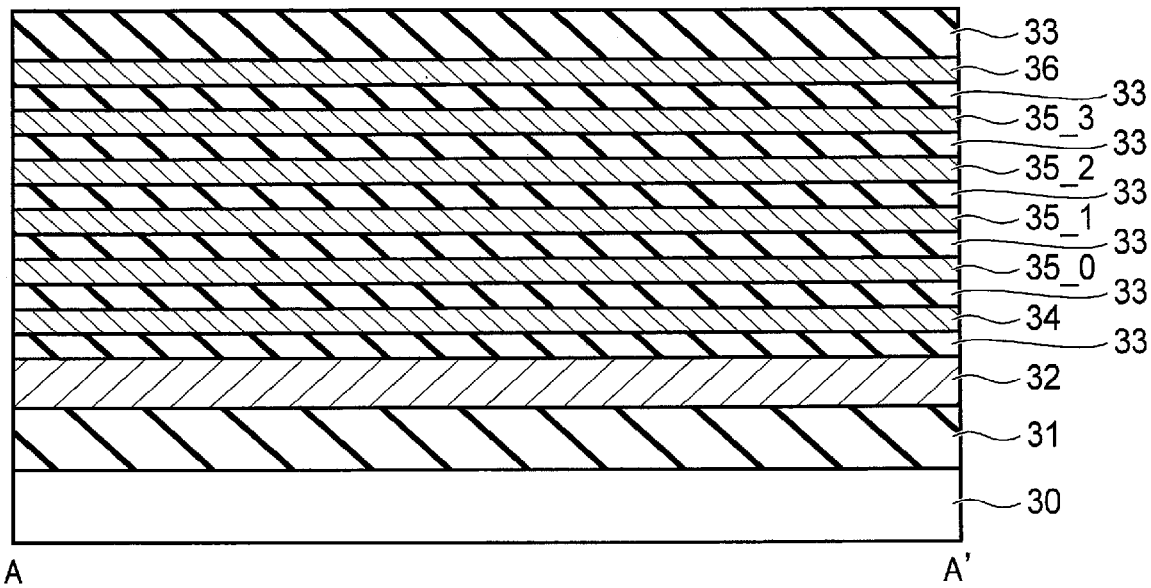
FIG. 8A is a cross-sectional view of the semiconductor memory device in a manufacturing step, taken along line A-A' according to the first embodiment.
Figure 8B:
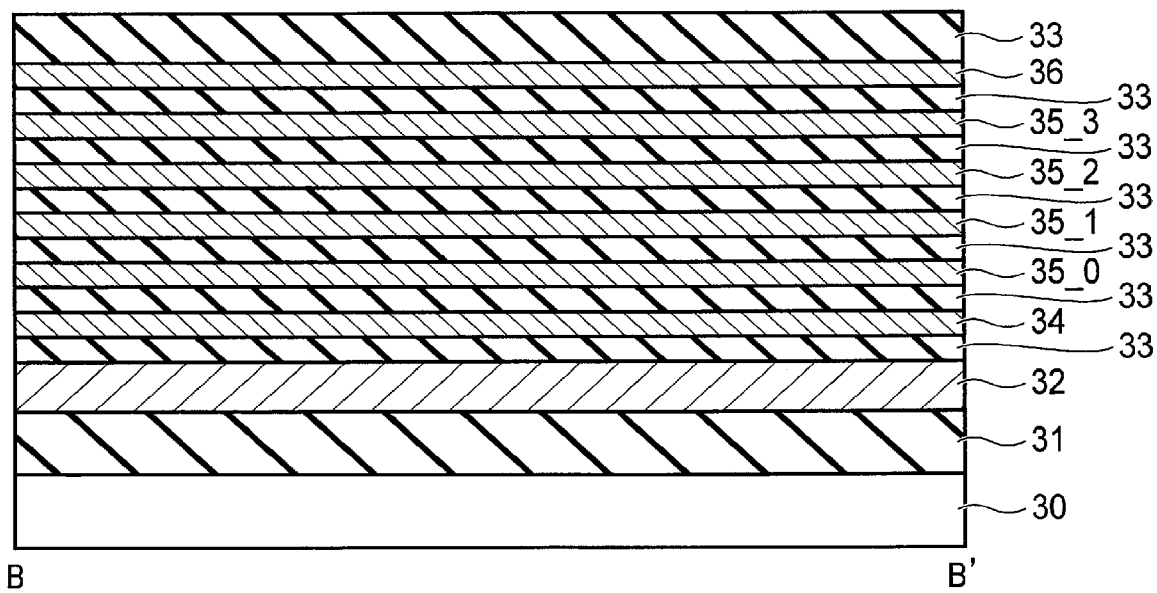
FIG. 8B is a cross-sectional view of the semiconductor memory device in the manufacturing step, taken along line B-B' according to the first embodiment.
Figure 9A:
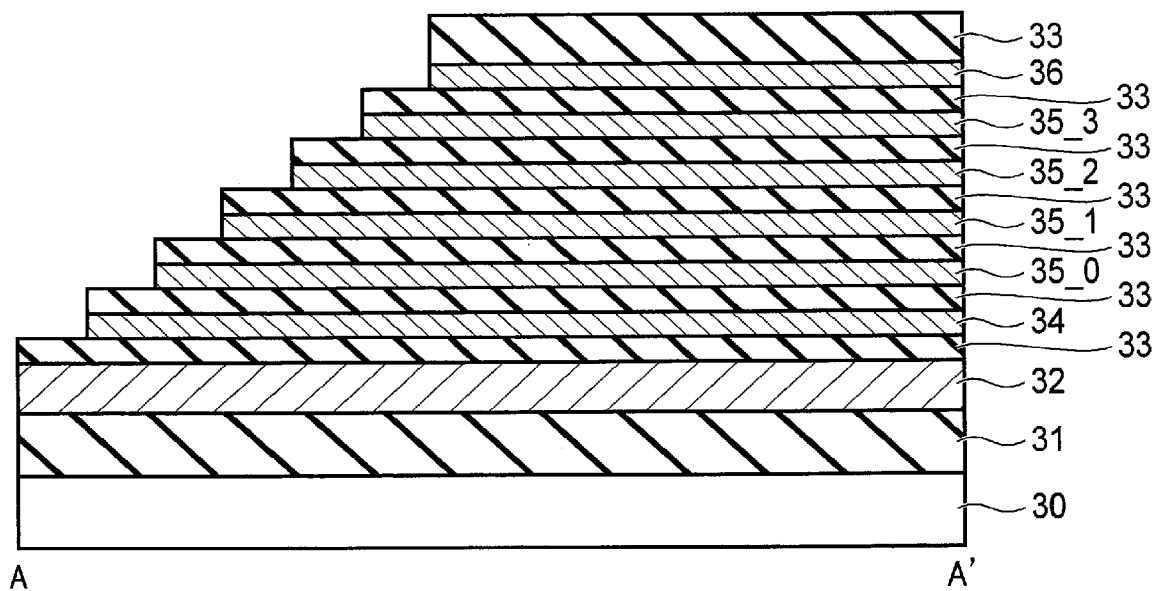
FIG. 9A is a cross-sectional view of the semiconductor memory device in a manufacturing step, taken along line A-A' according to the first embodiment.
Figure 9B:
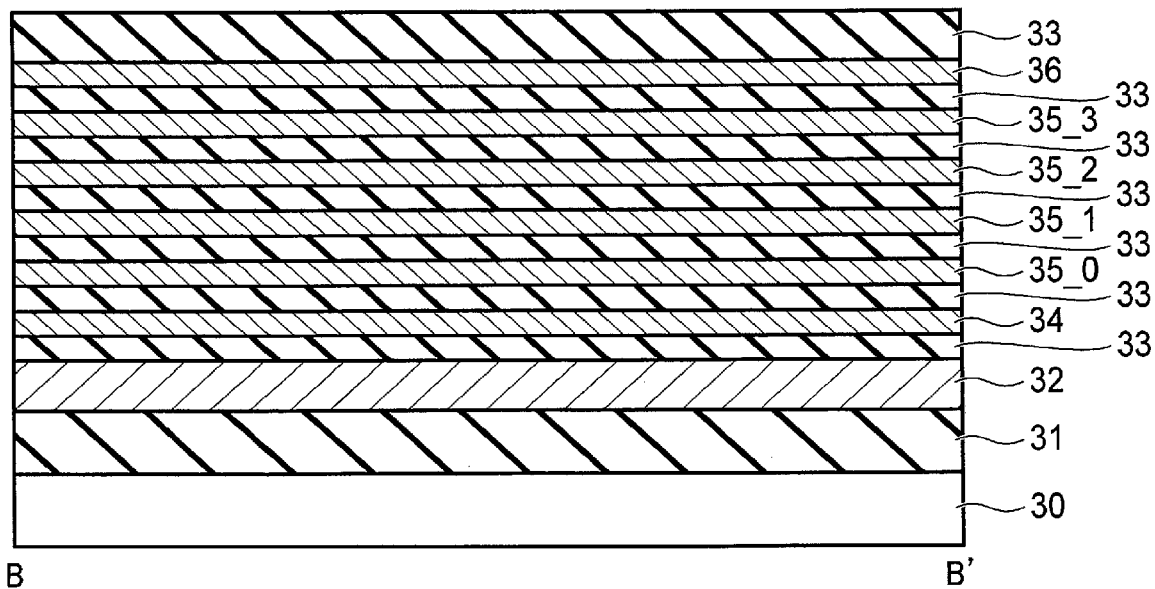
FIG. 9B is a cross-sectional view of the semiconductor memory device in the manufacturing step, taken along line B-B' according to the first embodiment.

A manufacturing method of the semiconductor memory device according to the first embodiment will be explained. FIGS. 8A and 8B to FIGS. 16A and 16B are cross-sectional views of structures in manufacturing steps of the semiconductor memory device according to the first embodiment. FIGS. 8A, 9A, . . . , and 16A are cross-sectional views of the structures in the manufacturing steps of the semiconductor memory device, taken along line A-A'. FIGS. 8B, 9B, . . . , and 16B are cross-sectional views of the structures in the manufacturing steps, taken along line B-B'.

First, as shown in FIGS. 8A and 8B, a conductive layer 32 is formed above a semiconductor substrate (e.g., a silicon monocrystalline substrate) 30. Then, a stacked body of a plurality of insulation layers 33 and a plurality of conductive layers 34, 35_0 to 35_3, and 36 is formed on the conductive layer 32. Specifically, for example, an insulation layer 31 is formed on a semiconductor substrate 30 as shown in FIGS. 8A and 8B by a chemical vapor deposition (CVD) method (or an atomic layer deposition (ALD) method). Then, a conductive layer 32 is formed on the insulation layer 31. Subsequently, for example, a plurality of insulation layers 33 and a plurality of conductive layers 34, 35_0 to 35_3, and 36 are alternately stacked on the conductive layer 32 by the CVD (or ALD) method.

Next, as shown in FIGS. 9A and 9B, stepped areas for providing electrical connection to the conductive layers 34, 35_0 to 35_3, and 36 of the stacked body are formed in a hookup area 200. Specifically, the conductive layers 34, 35_0 to 35_3, and 36 of the stacked body are etched in a stepwise manner by the photolithography method to form stepped areas in the conductive layers 34, 35_0 to 35_3, and 36, respectively, so that the stepped areas are drawn in the X direction in order as shown in FIG. 9A. In this step, the cross-sectional structure taken along line B-B' is maintained as in the previous step, as shown in FIG. 9B.

Next, as shown in FIGS. 10A and 10B to FIGS. 12A and 12B, the electrode layers 34H, 35_0H to 35_3H, and 36H are formed at the end portions (the stepped areas) of the conductive layers 34, 35_0 to 35_3, and 36. Specifically, the end portions of the conductive layers (polycrystalline silicon layers) 34, 35_0 to 35_3, and 36 are removed by wet etching using a compound liquid of nitric acid and hydrofluoric acid, for example, as shown in FIG. 10A. As a result, recessed portions 51 are formed between the insulation layers 33. In this step, the cross-sectional structure taken along line B-B' is maintained as in the previous step, as shown in FIG. 10B.

Figure 11A:
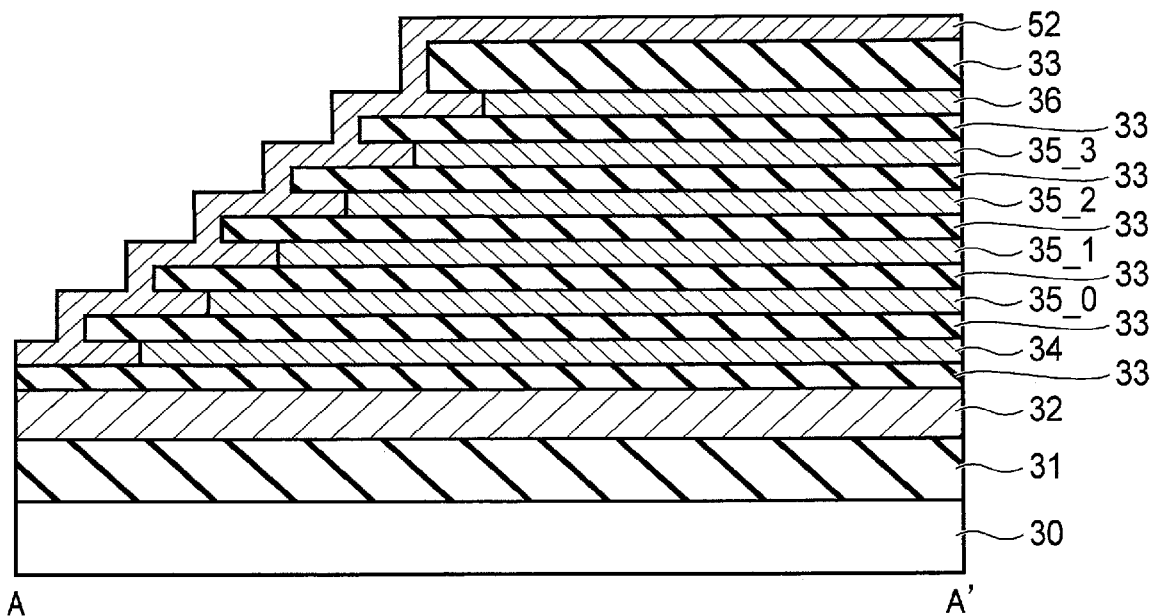
FIG. 11A is a cross-sectional view of the semiconductor memory device in a manufacturing step, taken along line A-A' according to the first embodiment.
Figure 11B:
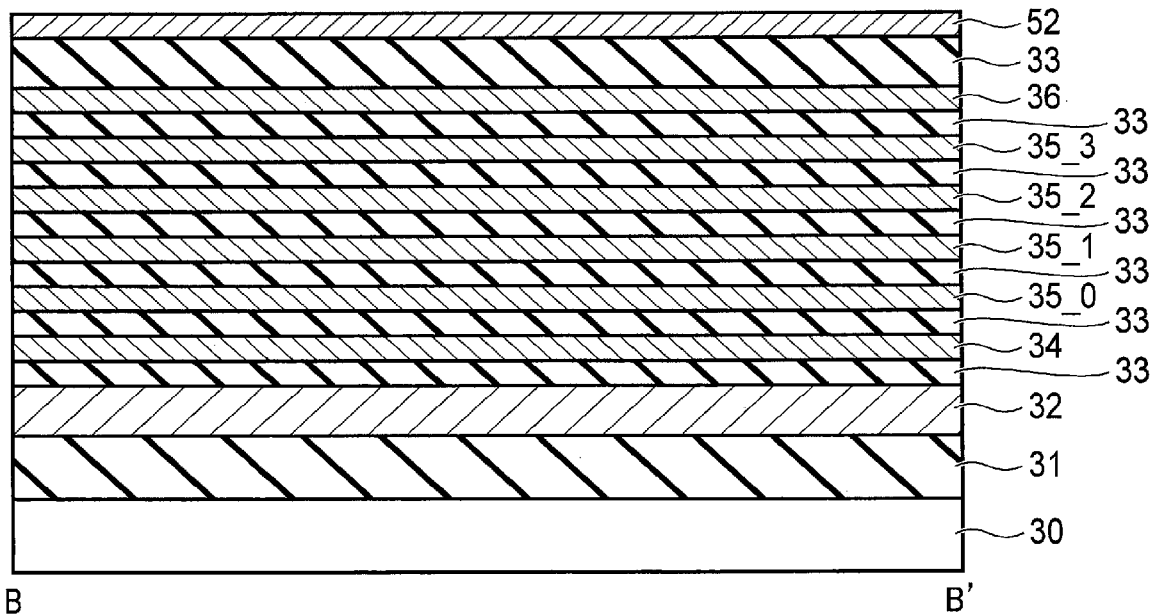
FIG. 11B is a cross-sectional view of the semiconductor memory device in the manufacturing step, taken along line B-B' according to the first embodiment.

Subsequently, a metal layer such as a tungsten layer 52 is formed on the structure shown in FIGS. 10A and 10B, namely the insulation layers 33 that include the recessed portions 51, by the CVD (or ALD) method, for example, as shown in FIGS. 11A and 11B. As a result, the recessed portions 51 are filled with the tungsten layer 52.

Then, unnecessary portions of the tungsten layer other than the tungsten layer 52 in the recessed portions 51 are removed by the RIE method, for example, so that the tungsten layer 52 remains in the recessed portions 51. As a result, the electrode layers 34H, 35_0H to 35_3H, and 36H are respectively formed in the stepped areas of the conductive layers 34, 35_0 to 35_3, and 36, as shown in FIG. 12A.

Figure 13A:
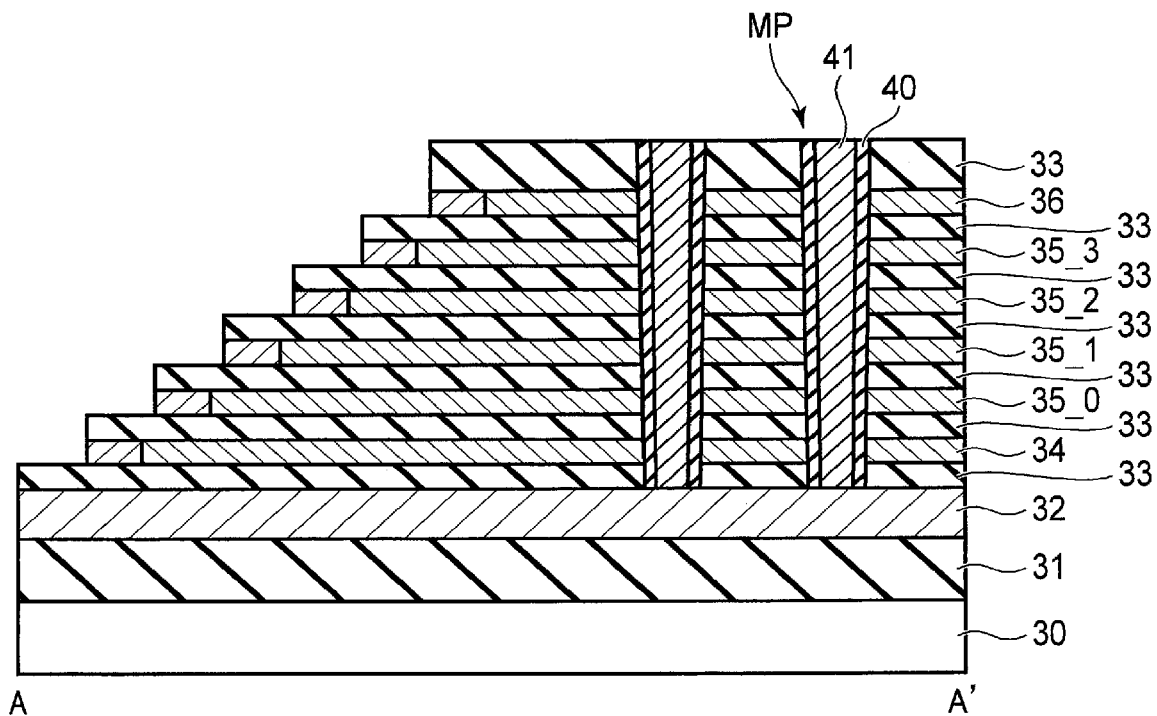
FIG. 13A is a cross-sectional view of the semiconductor memory device in a manufacturing step, taken along line A-A' according to the first embodiment.
Figure 13B:
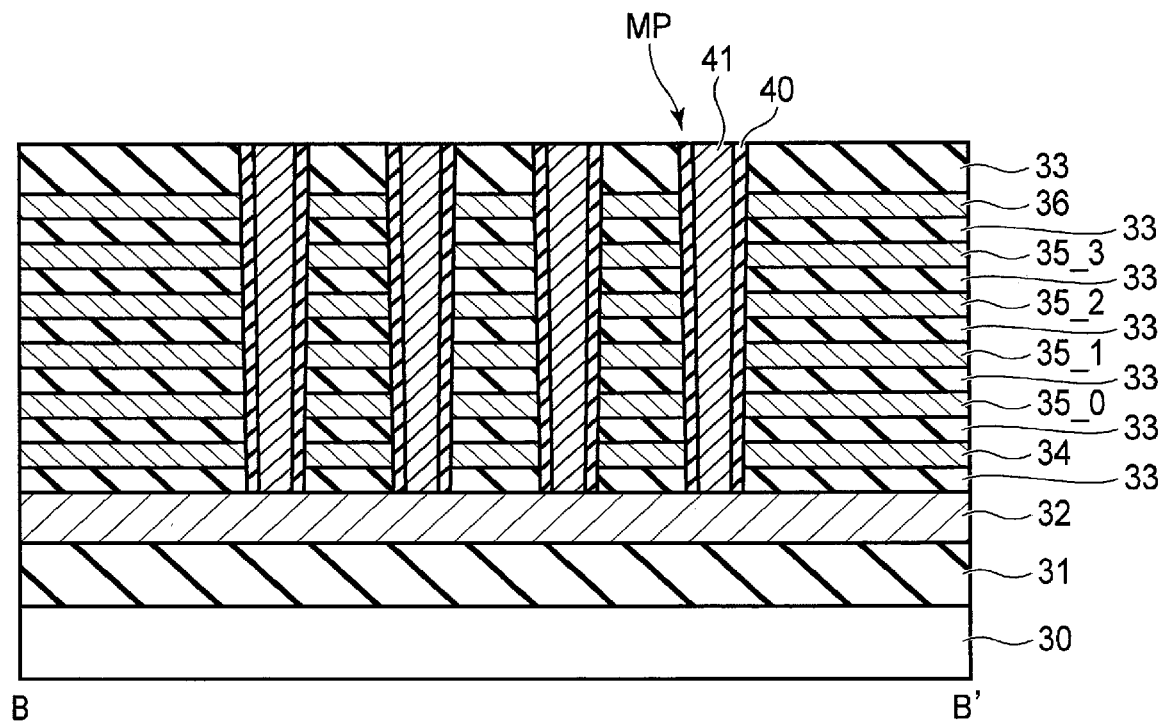
FIG. 13B is a cross-sectional view of the semiconductor memory device in the manufacturing step, taken along line B-B' according to the first embodiment.

Next, as shown in FIGS. 13A and 13B, the memory pillars MP are formed in the stacked body. Specifically, memory holes are formed in the insulation layers 33 and the conductive layers 34, 35_0 to 35_3, and 36 by the RIE method, for example. Then, a cell insulation film 40 is formed on the inner wall of each memory hole, and a semiconductor layer 41 is formed on the inner wall of the cell insulation film 40, by the CVD (or ALD) method, for example. The details of the memory pillars are shown in FIG. 6.

Next, as shown in FIGS. 14A and 14B, slits SLT to divide the stacked body in the X direction is formed. Specifically, trenches 53 for slits extending in the X direction are formed in the insulation layers 33 and the conductive layers 34, 35_0 to 35_3, and 36 by the RIE method, for example.

Figure 15A:
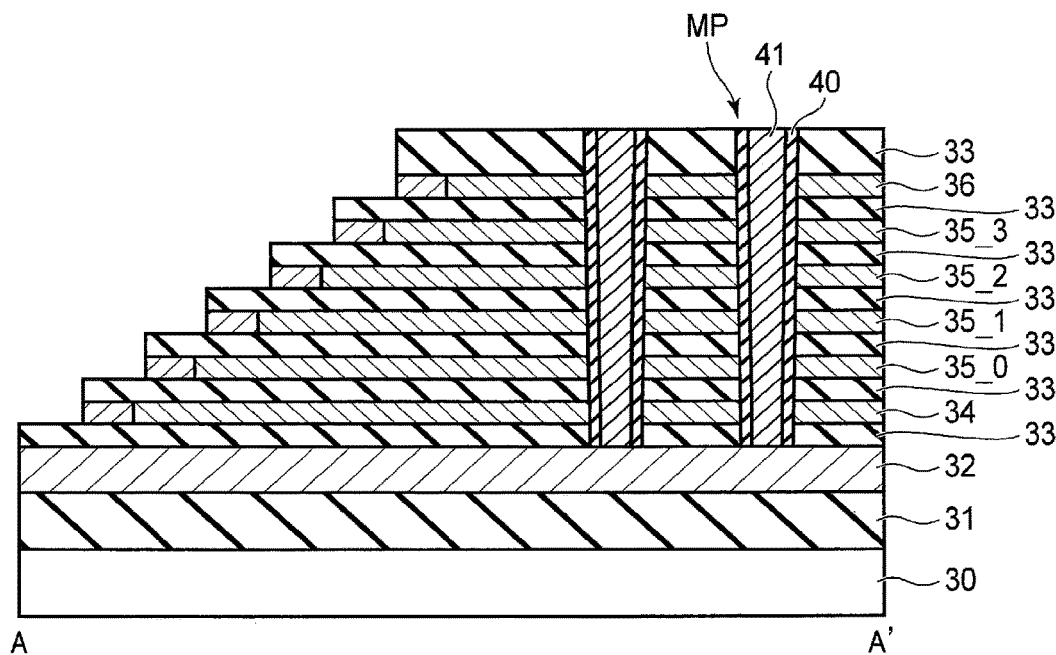
FIG. 15A is a cross-sectional view of the semiconductor memory device in a manufacturing step, taken along line A-A' according to the first embodiment.
Figure 15B:
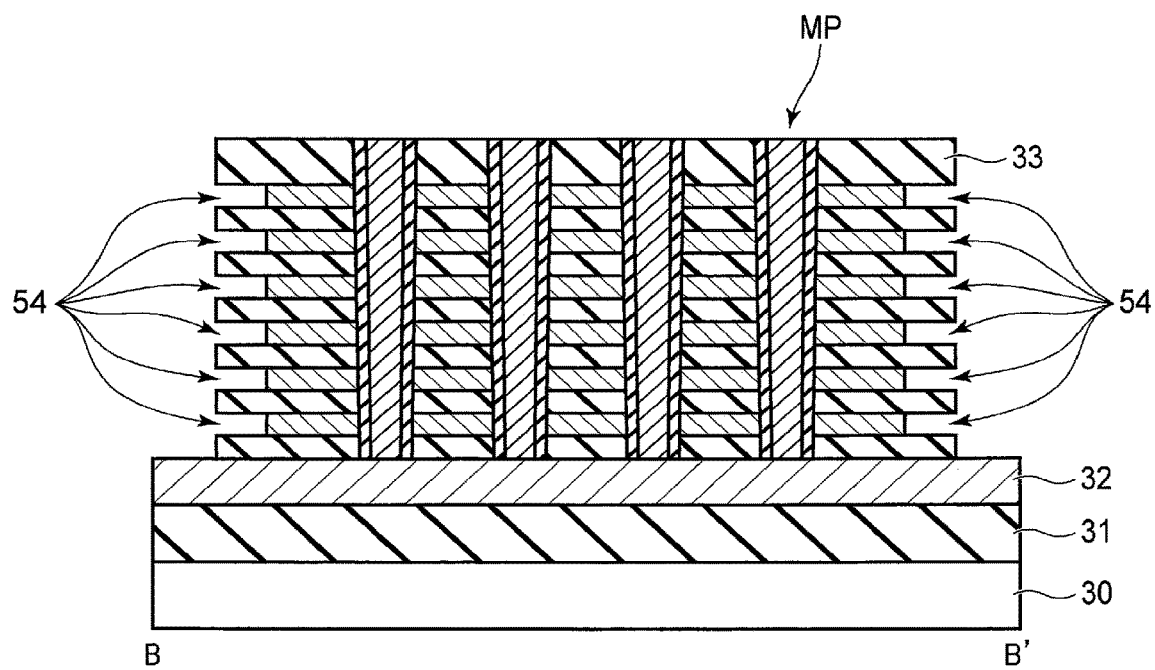
FIG. 15B is a cross-sectional view of the semiconductor memory device in the manufacturing step, taken along line B-B' according to the first embodiment.

Next, as shown in FIGS. 15A, 15B, 16A, and 16B, the electrode layers 34H, 35_0H to 35_3H, and 36H are formed at the end portions of the conductive layers 34, 35_0 to 35_3, and 36 in the Y direction. Specifically, as shown in FIG. 15B, the end portions of the conductive layers (polycrystalline silicon layers) 34, 35_0 to 35_3, and 36 are removed through the trenches 53 for slits by wet etching using a compound liquid of nitric acid and hydrofluoric acid, for example. As a result, recessed portions 54 are formed between the insulation layers 33. In this step, the cross-sectional structure taken along line A-A' is maintained as in the previous step as shown in FIG. 13A.

Subsequently, a metal layer such as a tungsten layer is formed on the structure shown in FIGS. 15A and 15B by the CVD (or ALD) method, for example. As a result, the recessed portions 54 are filled with the tungsten layer. Then, unnecessary portions of the tungsten layer other than the tungsten layer in the recessed portions 54 are removed by the RIE method, for example, so that the tungsten layer remains in the recessed portions 54. As a result, as shown in FIG. 16B, the electrode layers 34H, 35_0H to 35_3H, and 36H are respectively formed at the end portions of the conductive layers 34, 35_0 to 35_3, and 36.

Next, as shown in FIGS. 4 and 5, the contact plugs CP1 are formed on the electrode layers 34H, 35_0H to 35_3H, and 36H provided in the stepped areas in the hookup area 200. Specifically, the slits SLT are formed by filling the trenches 53 for slits with insulation layers. Then, an insulation layer 37 is formed on the memory pillars MP, the stacked body, and the stepped areas.

Subsequently, holes for contact plugs are made by etching the insulation layers 33 and 37 on the electrode layers 34H, 35_0H to 35_3H, and 36H by the RIE method. Then, holes for contact plugs are filled with tungsten by the CVD method. As a result, the contact plugs CP1 are formed on the electrode layers 34H, 35_0H to 35_3H, and 36H. Similarly, holes for contact plugs are made by etching the insulation layer 37 on the memory pillars MP by the RIE method. Then, the holes for contact plugs are filled with tungsten by the CVD method. As a result, the contact plugs CP2 are formed on the memory pillars MP. The formation of the contact plugs CP1 and the formation of the contact plugs CP2 may be performed separately or simultaneously.

After that, bit lines, the other wires, and insulation layers, etc., are formed, which completes the manufacturing of the semiconductor memory device.

1.4 Advantageous Effects of First Embodiment

According to the first embodiment, it is possible to provide a semiconductor memory device that can improve the reliability of operations to write and read, etc.

An advantageous effect of the first embodiment will be described in detail with reference to comparative examples of the first embodiment.

Figure 17:
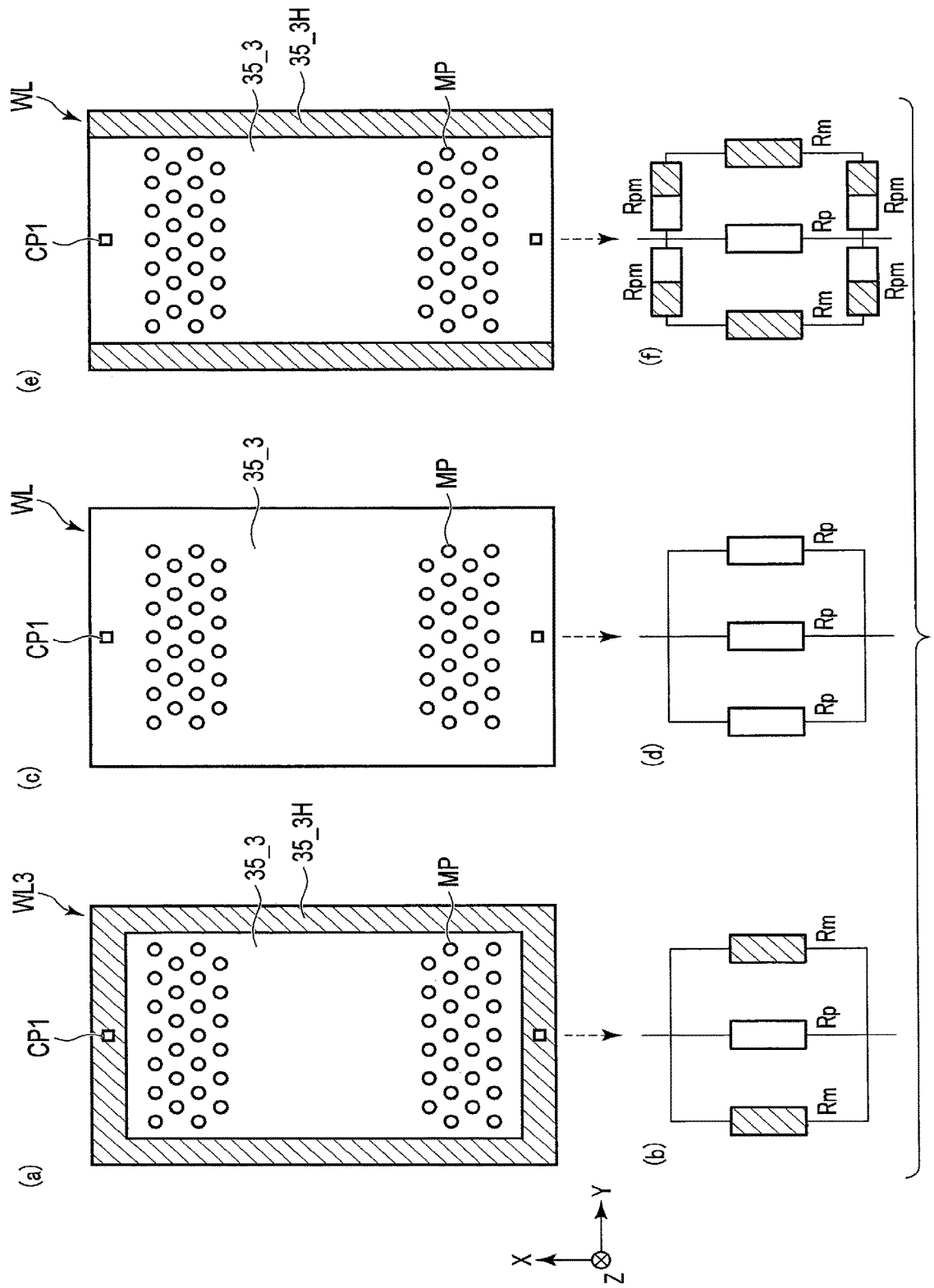
FIG. 17 shows plan views and circuit diagrams of word lines according to the first embodiment and comparative examples 1 and 2.

FIG. 17 show schematic views and circuit diagrams showing planar configurations of word lines according to the first embodiment and comparative examples 1 and 2. The word line WL3 is shown herein as an example; however, the other word lines and the select gate lines have the same configuration. The circuit diagrams of FIG. 17 show simplified equivalent circuits for checking a resistance of the word line WL3, and show a resistance between the contact plugs CP1 arranged at both ends of the word line WL3 in the X direction.

FIG. 17(a) is the same as FIG. 7, and shows the planar configuration of the word line WL3 according to the first embodiment. FIG. 17(b) shows an equivalent circuit of the word line WL3 shown in FIG. 17(a). FIG. 17(c) shows a planar configuration of a word line WL3 according to the comparative example 1, and FIG. 17(d) shows an equivalent circuit of the word line WL3 shown in FIG. 17(c). FIG. 17(e) shows a planar configuration of a word line WL3 according to the comparative example 2, and FIG. 17(f) shows an equivalent circuit of the word line WL3 shown in FIG. 17(e).

In the word line WL3 according to the first embodiment shown in FIG. 17(a), the conductive layer (polycrystalline silicon layer) 35_3 is provided at the center of the word line WL3, and the electrode layer (tungsten) 35_3H is provided at both ends of the word line WL3 in the X direction and the Y direction. In this case, a corresponding equivalent circuit is as shown in FIG. 17(b). Rm indicates a resistance of the electrode layer 35_3H, and Rp indicates a resistance of the conductive layer 35_3. The resistance Rm is lower than the resistance Rp, and satisfies Rm<Rp. In the structure of FIG. 17(a), the resistance between the contact plugs CP1 arranged at both ends can be represented by Rm.

In the word line WL according to the comparative example 1 shown in FIG. 17(c), a conductive layer 35_3 formed of a polycrystalline silicon layer is provided at the center and both ends of word line WL. In other words, the entire area of the word line WL is formed of the conductive layer 35_3. In this case, a corresponding equivalent circuit is as shown in FIG. 17(d). The resistance at both ends is Rp in this equivalent circuit, while the resistance at both ends is Rm in the circuit shown in FIG. 17(b). In the structure of FIG. 17(c), the resistance between the contact plugs CP1 arranged at both ends can be represented by Rp.

In the word line WL according to the comparative example 2 shown in FIG. 17(e), a conductive layer 35_3 formed of a polycrystalline silicon layer is provided at the center of the word line WL, and an electrode layer (tungsten) 35_3H is provided at both ends of the word line WL in the Y direction. In this case, a corresponding equivalent circuit is as shown in FIG. 17(f). Rpm indicates an interface resistance between the conductive layer 35_3 and the electrode layer 35_3H. Rpm is lower than the resistance Rp, and is higher than the resistance Rm. The resistance Rpm may be set lower than the resistance Rm; however, a case satisfying Rm<Rpm<Rp will be explained herein. In the structure of FIG. 17(e), the resistance between the contact plugs CP1 arranged at both ends can be represented by "Rm+2×Rpm." Accordingly, a resistance between the contact plugs CP1 arranged at both ends of a word line in the X direction is the lowest in the structure shown in FIG. 17(a).

Herein, a resistance on the path through which a voltage is actually applied by a word line, for example, from a contact plug CP1 arranged at one end to a memory pillar MP arranged at the other end, will be explained.

In the structure of FIG. 17(a), the resistance between the contact plug CP1 and a memory pillar MP can be represented by "Rm+Rpm." In the structure of FIG. 17(c), the resistance between the contact plug CP1 and the memory pillar MP can be represented by Rp. In the structure of FIG. 17(e), the resistance between the contact plug CP1 and the memory pillar MP can be represented by "Rm+2×Rpm." The resistance Rp is sufficiently higher than "Rm+Rpm." Accordingly, a resistance between the contact plug CP1 and the memory pillar MP is the lowest in the structure shown in FIG. 17(a).

Therefore, the circuit resistance of the select gate line SGS, the word lines WL0 to WL3, and the select gate line SGD according to the first embodiment is lower than the circuit resistance of the comparative examples 1 and 2. Thus, the resistance of the word lines and the select gate lines can be decreased; accordingly, voltage drop due to the resistance in the word lines and the select gate lines can be suppressed, and the time necessary for stabilizing the voltage in the word lines and the select gate lines can be shortened. As a result, it is possible to improve reliability of operations to write and read, etc., in the semiconductor memory device of the first embodiment.

2. Second Embodiment

A semiconductor memory device according to a second embodiment will be explained. In the semiconductor memory device explained in the second embodiment, cavities (or hollows) are provided between the select gate line SGS and the word line WL0, between the word lines WL0 to WL3, and between the word line WL3 and the select gate line SGD.

A plan view of the semiconductor memory device according to the second embodiment is the same as FIG. 3. FIG. 18 is a cross-sectional view of the semiconductor memory device according to the second embodiment, taken along line A-A'. FIG. 19 is a cross-sectional view taken along line B-B'. The bit lines are not shown in FIGS. 18 to 19.

In the second embodiment, the insulation layers 33 between the conductive layers 34 and 35_0, between the conductive layers 35_0 to 35_3, and between the conductive layers 35_0 and 36 of the first embodiment shown in FIGS. 4 and 5 are replaced with cavities 61 as shown in FIGS. 18 to 19. The other configurations are the same as the first embodiment.

In other words, the insulation layers 33 and the conductive layers 34, 35_0 to 35_3, and 36 are stacked on the conductive layer 32 in the stacked body provided in the first embodiment shown in FIGS. 4 and 5, while the insulation layers 33 in the stacked body are removed and the conductive layers 35_0 to 35_3 and 36 are stacked with the cavities 61 interposed therebetween in the second embodiment.

In the manufacturing method according to the second embodiment, a step of removing the insulation layers 33 from the structure shown in FIGS. 16A and 16B is added. Specifically, after the step shown in FIGS. 16A and 16B, the insulation layers 33 are removed through the trenches for the slits SLT by wet etching using an etching liquid of hydrofluoric acid, for example. If the conductive layers 34, 35_0 to 35_3, and 36 come into contact with each other due to the removal of the insulation layers 33, a structure that supports the conductive layers 34, 35_0 to 35_3, and 36 such as a structure similar to a memory pillar may be formed in the hookup area 200. The other steps are the same as the first embodiment.

According to the second embodiment, it is possible to decrease the dielectric constant between the conductive layers 34, 35_0 to 35_3, and 36, namely between the select gate line SGS, the word lines WL0 to WL3, and the select gate line SGD, by hollowing the insulation layers 33 between the conductive layers 34, 35_0 to 35_3, and 36. As a result, the inter-wiring capacitance generated between a plurality of word lines and between a word line and a select gate line can be decreased, and the wiring delay, etc., can be improved. The other advantageous effects are the same as in the first embodiment described above.

3. Modifications

In the above embodiments, a NAND flash memory is explained as an example of the semiconductor memory device. However, the above embodiments can be applied to not only a NAND flash memory but also the other semiconductor memories in general in which each of signal lines such as word lines and select gate lines has a plate-like shape and has a coupling area coupled to a contact plug. Moreover, the above embodiments can be also applied to various memory devices other than a semiconductor memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device comprising:
   a plurality of first conductive layers stacked in a first direction and extending in a second direction crossing the first direction;
   a pillar extending through the first conductive layers in the first direction;
   a plurality of second conductive layers provided at first ends of the first conductive layers in the second direction;
   a plurality of third conductive layers respectively sandwiching the first conductive layers and the second conductive layers in a third direction crossing the first and second directions, extending in the second direction, electrically connected to the second conductive layers and including a metal; and
   a plurality of contact plugs provided on the second conductive layers, and extending in the first direction.

2. The semiconductor memory device according to claim 1,
   wherein each first conductive layer extends in a third direction crossing the first direction and the second direction, and each second conductive layer is provided at a second end of a respective first conductive layer in the third direction.

3. The semiconductor memory device according to claim 1,
   wherein each second conductive layer is coupled to a respective first conductive layer, and has an electric resistance lower than an electric resistance of the respective first conductive layer.

4. The semiconductor memory device according to claim 1,
   wherein each second conductive layer provided at the first end of a respective first conductive layer is arranged in a stepwise manner in the second direction.

5. The semiconductor memory device according to claim 1,
   wherein a length of each second conductive layer in the second direction is longer than an outer diameter of a respective contact plug.

6. The semiconductor memory device according to claim 1,
   wherein each second conductive layer and each first conductive layer have equal thickness in the first direction.

7. The semiconductor memory device according to claim 1,
   wherein each first conductive layer includes polycrystalline silicon, and each second conductive layer includes a metal.

8. The semiconductor memory device according to claim 1,
   wherein the pillar includes a charge storage film, a tunnel insulation film, and a semiconductor layer.

9. The semiconductor memory device according to claim 8,
   wherein the pillar includes an intersection with each first conductive layer, the intersection functioning as a memory cell transistor.

10. The semiconductor memory device according to claim 9,
    wherein each first conductive layer includes a word line coupled to a gate of the memory cell transistor.

11. A semiconductor memory device comprising:
    a plurality of first conductive layers stacked in a first direction and extending in a second direction crossing the first direction;
    a plurality of pillars extending through the plurality of first conductive layers in the first direction and including a semiconductor layer; and
    a plurality of contact plugs respectively provided on the plurality of first conductive layers and respectively extending in the first direction, wherein
    at least one of the plurality of first conductive layers including:
      a pair of first portions extending in the second direction and including a metal;
      a second portion provided in a third direction of the first portions and including silicon, the third direction crossing the first and second directions; and
      a third portion provided on at least one side of the second portion in the second direction, extending in the third direction, electrically connected to the pair of first portions, and including a metal,
    the plurality of pillars extend through the second portion of the at least one of the plurality of first conductive layers, and
    the plurality of contact plugs are respectively provided on the third portion of the at least one of the plurality of first conductive layers.

12. The semiconductor memory device according to claim 11,
    wherein the third portion is electrically coupled to the second portion, and has an electric resistance lower than an electric resistance of the second portion.

13. The semiconductor memory device according to claim 11,
    wherein the third portion of the at least one first conductive layer and the second portion of the at least one first conductive layer have equal thickness in the first direction.

14. The semiconductor memory device according to claim 11,
    wherein a length of the third portion of the at least one first conductive layer in the second direction is longer than an outer diameter of the respective contact plug.

15. The semiconductor memory device according to claim 11,
    wherein the third portion of the at least one first conductive layer is arranged in a stepwise manner in the second direction.

16. The semiconductor memory device according to claim 11,
    wherein the second portion of the at least one first conductive layer includes polycrystalline silicon.

17. The semiconductor memory device according to claim 11,
    wherein the metal includes tungsten.

18. The semiconductor memory device according to claim 11,
    wherein each pillar includes a charge storage film, a tunnel insulation film, and a semiconductor layer.

19. The semiconductor memory device according to claim 18,
    wherein each pillar includes an intersection with the second portion of the at least one first conductive layer, the intersection functioning as a memory cell transistor.

20. The semiconductor memory device according to claim 19,
    wherein the at least one first conductive layer functions as a word line coupled to a gate of the memory cell transistor.

\* \* \* \* \*